US010720950B2

(12) United States Patent
An et al.

(10) Patent No.: US 10,720,950 B2
(45) Date of Patent: Jul. 21, 2020

(54) ELECTRONIC DEVICE AND METHOD FOR TESTING WIRELESS COMMUNICATION CIRCUIT

(71) Applicant: Samsung Electronics Co., Ltd., Gyeonggi-do (KR)

(72) Inventors: Yongjun An, Gyeonggi-do (KR); Jihoon Kim, Gyeonggi-do (KR); Youngmin Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/419,172

(22) Filed: May 22, 2019

(65) Prior Publication Data

US 2019/0363745 A1 Nov. 28, 2019

(30) Foreign Application Priority Data

May 23, 2018 (KR) .......................... 10-2018-0058253

(51) Int. Cl.
*H04B 1/28* (2006.01)
*H04B 1/00* (2006.01)
*H03D 7/14* (2006.01)

(52) U.S. Cl.
CPC ............. *H04B 1/28* (2013.01); *H03D 7/1408* (2013.01); *H04B 1/0078* (2013.01)

(58) Field of Classification Search
CPC combination set(s) only.
See application file for complete search history.

(56) References Cited

U.S. PATENT DOCUMENTS

| 5,428,626 | A | * | 6/1995 | Frisch | ............ G01R 31/318513 |
| | | | | | 324/73.1 |
| 8,942,655 | B2 | | 1/2015 | Beamish et al. | |
| 9,887,760 | B1 | * | 2/2018 | Sridharan | ............ H04B 7/0617 |
| 2008/0233900 | A1 | * | 9/2008 | Baker | ...................... H03L 7/085 |
| | | | | | 455/113 |

* cited by examiner

*Primary Examiner* — Junpeng Chen
(74) *Attorney, Agent, or Firm* — Cha & Reiter, LLC.

(57) ABSTRACT

Provided is an electronic device includes an interface for connection to an external device; and a processor electrically connected to the interface, wherein the at least one processor is configured to: set a first radio frequency (RF) signal port of a first chipset to operate in RF signal transmission mode, and set a second RF signal port of a second chipset to operate in RF signal reception mode; obtain an error of transmission performance of the first RF signal port based on a comparison between a designated transmission reference that is input to the first RF signal port and a characteristic of a first intermediate frequency (IF) signal that is output via the second RF signal port; obtain a first compensation value to enable the transmission performance of the first RF signal port to converge to the transmission reference, on the basis of the error of the transmission performance; and store at least one of the error of the transmission performance and the first compensation value in the first chipset via the interface.

20 Claims, 11 Drawing Sheets

ELECTRONIC DEVICE AND METHOD FOR TESTING WIRELESS COMMUNICATION CIRCUIT

CROSS-REFERENCE TO RELATED APPLICATION(S)

This application is based on and claims priority under 35 U.S.C. § 119 to Korean Patent Application No. 10-2018-0058253, filed on May 23, 2018, in the Korean Intellectual Property Office, the disclosure of which is incorporated by reference herein in its entirety.

BACKGROUND

1) Field

The disclosure relates to an electronic device and method for testing a radio frequency (RF) signal transmission or reception performance of a wireless communication circuit (e.g., a radio frequency integrated circuit (RFIC)).

2) Description of Related Art

The above information is presented as background information only to assist with an understanding of the disclosure. No determination has been made, and no assertion is made, as to whether any of the above might be applicable as prior art with regard to the disclosure.

A plurality of chipsets supporting wireless communication in an ultrahigh frequency (mm wave) band may be contained in an electronic device (e.g., a smart phone). In order to minimize a difference between the chipsets, test and calibration associated with RF transmission or reception performance may be performed for each chipset. For example, each of the chipsets can be connected to test equipment. The test equipment measures the characteristic (e.g., a current, power, phase, or gain) of a signal output from each chipset to the test equipment. The test and calibration associated with emission performance of a chipset may be performed on the basis of the measured characteristic. Alternatively, a scheme in which an antenna is connected to each chipset, and an antenna chamber measuring an RF signal emitted from the antenna may be used.

SUMMARY

In accordance with an aspect of the disclosure, an electronic device includes an interface for connection to an external device; and a processor electrically connected to the interface, wherein the at least one processor is configured to: set a first radio frequency (RF) signal port of a first chipset to operate in RF signal transmission mode, and set a second RF signal port of a second chipset to operate in RF signal reception mode; obtain an error of transmission performance of the first RF signal port based on a comparison between a designated transmission reference that is input to the first RF signal port and a characteristic of a first intermediate frequency (IF) signal that is output via the second RF signal port; obtain a first compensation value to enable the transmission performance of the first RF signal port to converge to the transmission reference, on the basis of the error of the transmission performance; and store at least one of the error of the transmission performance and the first compensation value in the first chipset via the interface.

In another aspect, there is provided a method of operating an electronic device. The method includes selecting a first radio frequency (RF) signal port from a first chipset and a second RF signal port from a second chipset, wherein the first chipset and the second chipset are electrically connected to the electronic device via an interface; setting the first RF signal port to operate in an RF signal transmission mode, and setting the second RF signal port to operate in an RF signal reception mode; obtaining an error of transmission performance of the first RF signal port on the basis of a characteristic of a first intermediate frequency (IF) signal that is input to the first RF signal port and is output via the second RF signal port compared to a designated transmission reference; obtaining a first compensation value to enable the transmission performance of the first RF signal port to converge to the transmission reference on the basis of the error of the transmission performance; and storing at least one of the error of the transmission performance and the first compensation value in the first chipset via the interface.

In another aspect, there is a system for testing a wireless communication circuit. The system comprises a signal generation device; a signal analysis device; a power source device; a calibration device; and an assist device configured to electrically connect a first chipset and a second chipset such that transmission or reception of a radio frequency (RF) signal is performed between the first chipset and the second chipset, and configured to electrically connect the first chipset and the second chipset to the signal generation device, the signal analysis device, the power source device, and the calibration device, wherein the calibration device is configured to: control the signal generation device to generate and transmit an LO signal to the first chipset and the second chipset; control the signal generation device to generate and transmit an IF signal to a chipset that operates in the RF signal transmission mode among the first chipset and the second chipset; control a first RF signal port of the first chipset to operate in an RF signal transmission mode, and control a second RF signal port of the second chipset to operate in an RF signal reception mode; receive, from the signal analysis device, characteristic information of a first IF signal that is input to the first RF signal port and is output via the second RF signal port; obtain an error of transmission performance of the first RF signal port compared to a designated transmission reference, on the basis of the characteristic information of the first IF signal; obtain a first compensation value to enable the transmission performance of the first RF signal port to converge to the transmission reference on the basis of the error of the transmission performance; and store at least one of the error of the transmission performance and the first compensation value in the first chipset.

BRIEF DESCRIPTION OF THE DRAWINGS

For a more complete understanding of the disclosure and its advantages, reference is now made to the following description taken in conjunction with the accompanying drawings, in which like reference numerals represent like parts.

DETAILED DESCRIPTION

However, connecting each chipset to test equipment or an antenna, and thus, mass production is not easy and requires a lot of man-hours. For example, when an operation of connecting a chipset that supports wireless communication in an ultrahigh frequency (millimeter (mm) wave) band to test equipment or an antenna is performed, assembling deviation may occur, or power loss of an RF signal may occur in a wiring line used for connecting test equipment or an antenna to an RFIC. Accordingly, a performance test and calibration may be inaccurate, and a difference in RF transmission or reception performance between products containing chipsets may be significantly high. Accordingly, it is difficult to test and calibrate a chipset in the state in which the chipset is not contained in a product. Therefore, in many cases, test and calibration is performed after the chip set is mounted in the product. However, the scheme that performs calibration after containing a chipset in a product may not filter out or detect a defective chipset contained in a product. Accordingly, this may significantly affect the yield of product.

According to certain embodiments, there is provided an electronic device and a method which may accurately test and calibrate a chipset in the state in which the chipset is not contained in a product.

According to certain embodiments, there is provided an electronic device and a method which may be capable of testing and calibrating a chipset, and filtering out a defective product, without using an antenna or inspection equipment that supports an ultrahigh frequency band.

According to certain embodiments, there is provided an electronic device and a method which can accurately test and calibrate a chipset in the state in which the chipset is not contained in a product.

According to certain embodiments, there is provided an electronic device and a method which can test and calibrate a chipset, and filter out a defective product, without using an antenna or inspection equipment that supports an ultrahigh frequency (mm wave) band.

Therefore, differences in performance between chipsets may be reduced resulting in a significant increase in product yield.

Figure 1:
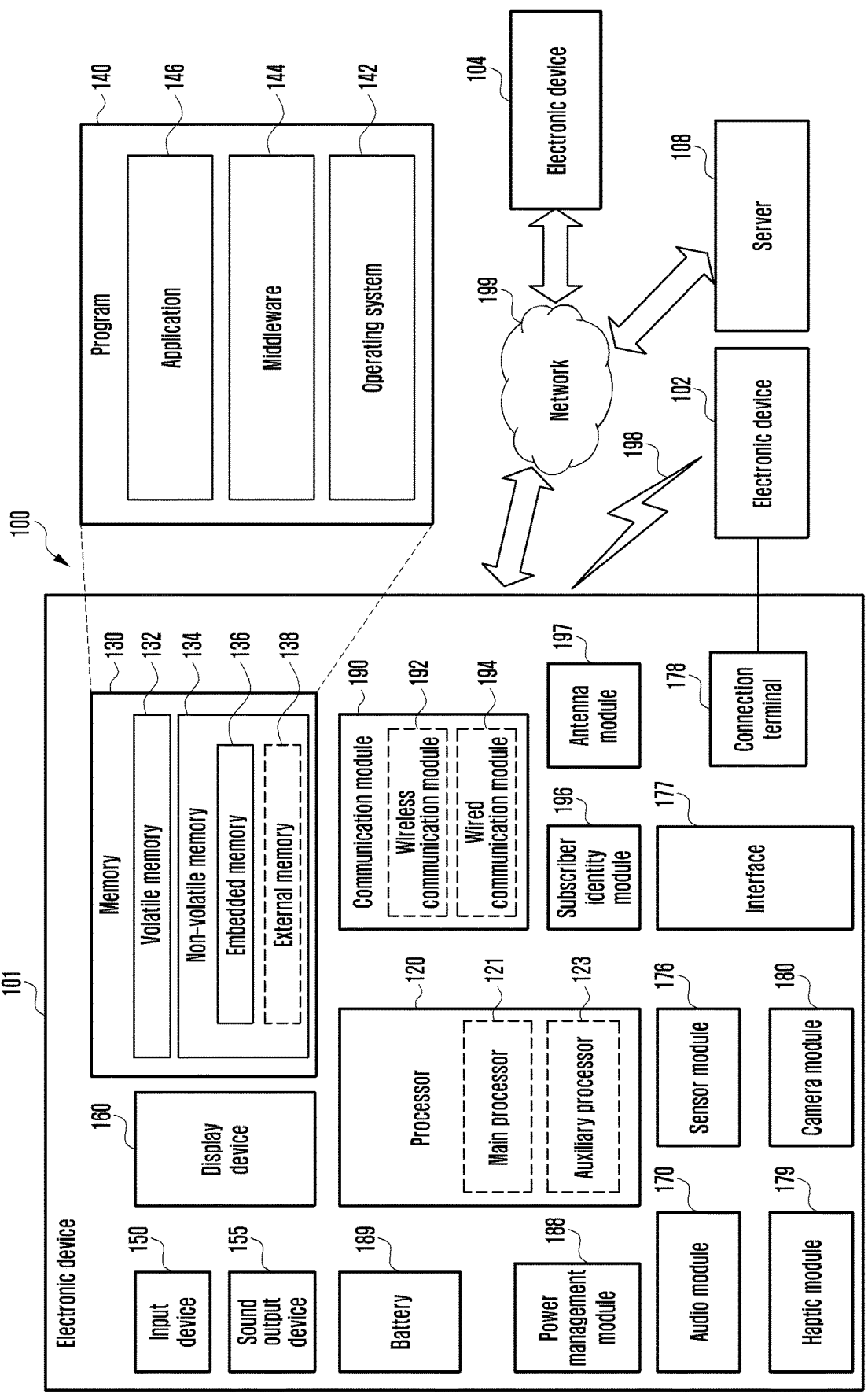
FIG. 1 is a diagram illustrating an electronic device within a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include at least one processor 120 ("processor" as used in the singular shall be understood to refer to "at least one processor"), memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

In certain embodiments, electronic device 101 can use connection terminal 178 for connection to an external device such as electronic device 102. The external device can include a first RF signal port of a first chipset and a second RF signal port of a second chipset. The processor can be configured to obtain a compensation values to enable transmission performance of the RF signal ports to converge to a transmission reference.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
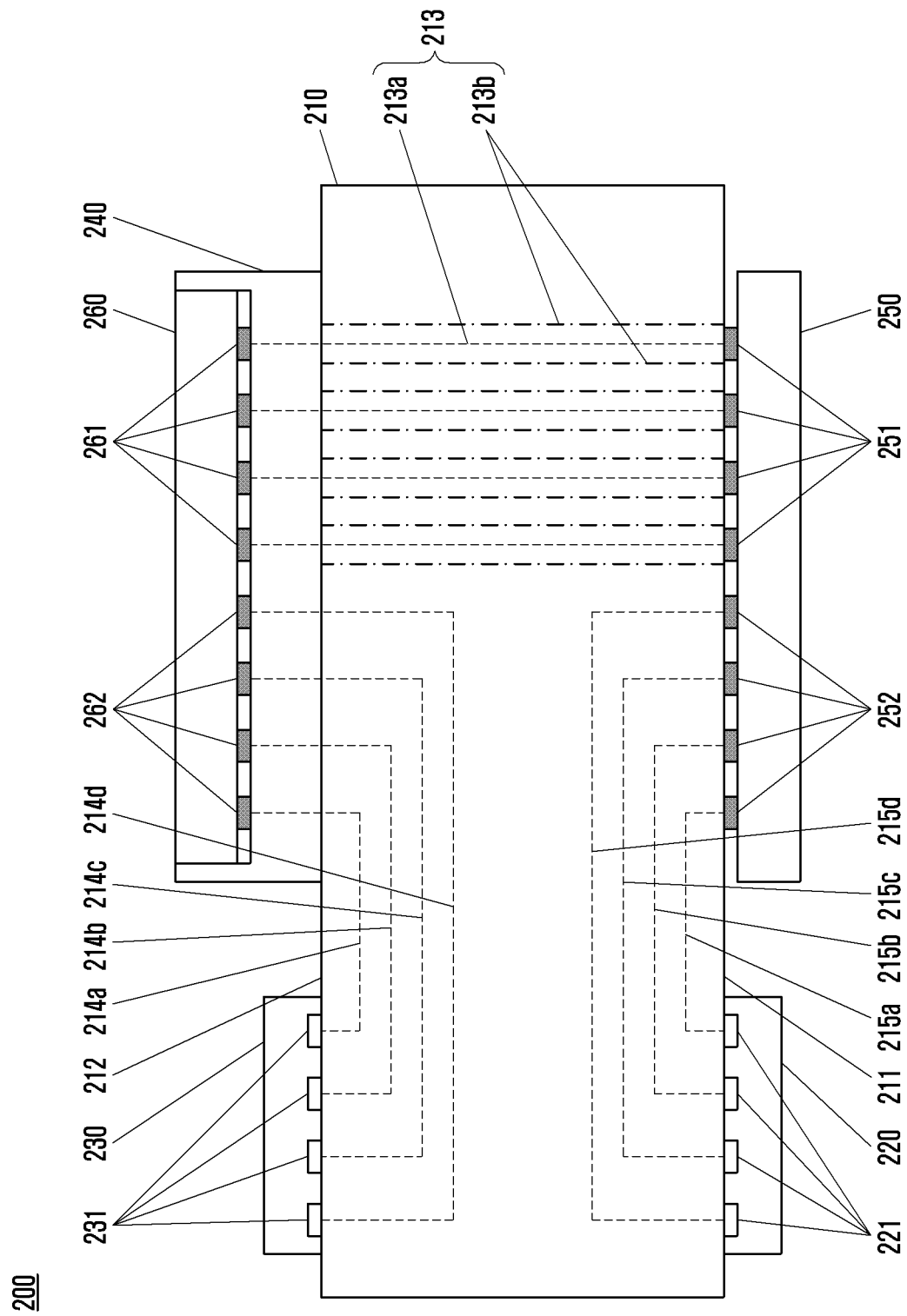
FIG. 2 is a diagram illustrating a jig used for testing and calibrating an RF signal transmission or reception performance of each RFIC in a chipset configured to include a plurality of ports that supports wireless communication in an ultrahigh frequency band (mmwave) according to certain embodiments.

FIG. 2 is a diagram illustrating a jig used for testing and calibrating an RF signal transmission or reception performance of each port in a chipset, configured to include a plurality of ports that supports wireless communication in an ultrahigh frequency band (mm wave).

Referring to FIG. 2, a jig 200 according to certain embodiments may include a printed circuit board (PCB) 210, a first connector 220, a second connector 230, and a socket 240.

The jig 200 can interconnect a first connector 220, a second connector 230, a first chipset 250, and a second chipset 260. The first connector 220 includes terminals 221 and the first chipset 250 includes first ports 252. The terminals 221 of the first connector 220 are interconnected to the first ports 252 of the first chipset 250 via lines 215a-215d:
- 215a can carry a local oscillator (LO) signal
- 215b can carry an intermediate frequency signal (IF)
- 215c can carry a power signal, and
- 215d can carry a control signal.

The second connector 230 includes terminals 231 and the second chipset 260 includes first ports 262. The terminals 231 of the second connector 230 are interconnected to the first ports 262 of the second chipset 250 via lines 214a-214d:
- 214a can carry a local oscillator (LO) signal
- 214b can carry an intermediate frequency signal (IF)
- 214c can carry a power signal, and
- 214d can carry a control signal.

The first chipset 250 includes RF signal ports 251 and the second chipset 260 includes RF signal ports 261. RF signal ports 251 of first chipset 250 and the RF signal ports 261 of second chipset 260 are connected by lines 213a through vias 213b.

The first chipset 250 is verified and known to be operate accurately (referred to as the "gold standard"), and can be used to test second chipset 260 (known as a "device under test" DUT).

The jig 200 can test the second chipset 260 by setting the first chipset 250 in transmission mode. The first chipset 250 converts the IF signal 215c to an RF signal that is transmitted to the second chipset 260. The IF signal can be considered the transmission reference signal. The second chipset 260 converts the RF signal to an IF signal 214c. Ideally signal 215c and signal 214c will be identical. However, since first chipset 250 is the gold standard, differences or errors between signals 215c and signal 214c are deemed the "fault" during conversion of the RF signal to the IF signal by the second chipset 260. Accordingly, the differences or errors can be used to calibrate or compensate the second chipset 260.

The second chipset 260 can then be set to reception mode. The second chipset 260 converts the IF signal 214c to an RF signal that is transmitted to the first chipset 250. The first chipset 250 converts the RF signal to an IF signal 215c. Ideally signal 215c and signal 214c will be identical. However, since first chipset 250 is the gold standard, differences or errors between signals 215c and signal 214c are deemed the "fault" of second chipset 260 during conversion of the IF signal to the RF signal. Accordingly, the differences or errors can be used to calibrate or compensate the second chipset 260.

According to certain embodiments, the PCB 210 is a structure that supports other components. For example, the first connector 220 or a first chipset 250 is disposed in a first side 211 of the PCB 210, and the second connector 230 or the socket 240 is disposed in a second side 212 of the PCB 210 which faces in the opposite direction of the first side 211. The first chipset 250 may be a so-called "gold standard", the RF signal transmission or reception performance of which is known to be accurate, and may be surface-mounted in the first side 211 of the PCB 210.

According to certain embodiments, the PCB 210 is a structure that electrically connects the first chipset 250 and the second chipset 260, so that the first chip set 250 and the second chipset 260 exchange signals. For example, a plurality of vias 213 that passes straight through the first side 211 and the second side 212 of the PCB 210 may be disposed in the PCB 210. First RF signal ports 251 of the first chipset 250 may be electrically connected to second RF signal ports 261 of the second chipset 260 that is inserted into the socket 240 in a one-to-one manner, via the plurality of vias. Each of the first RF signal ports 251 may be electrically connected to the first chipset 250. Each of the second RF signal ports 261 may be electrically connected to the second chipset 260. The plurality of vias 213 may be configured to include an RF signal wiring line 213a and a conductor 213b (e.g., cooper) enveloping the RF signal wiring line 213a, similar to, for example, the structure of a coaxial cable. For example, the conductor 213b may protect an RF signal that flows through the wiring line 213a, from an external electric interference. Accordingly, when an RF signal passes straight through the vias 213, the RF signal may be transferred from one of the first RF signal ports 251 of the first chipset 250 to one of the second RF signal ports 261 of the second chipset 260 (or vice versa) with power loss as low as possible.

According to certain embodiments, the PCB 210 may be a structure that electrically connects the first chip 250 to the first connector 220, and electrically connects the second chipset 260 to the second connector 230, such that an external device may exchange a signal with the chipsets 250 and 260 via the connectors 220 and 230. For example, a plurality of first wiring lines 215a to 215d to electrically connect the first ports 252 of the first chipset 250 to terminals 221 of the first connector 220, and a plurality of second wiring lines 214a to 214d to electrically connect the second ports 262 of the second chipset 260 to terminals 231 of the second connector 230 may be included in the PCB 210. For example, the first wiring lines 215a to 215d may include a first local oscillator (LO) signal wiring line 215a, at least one first power wiring line 215b, a first intermediate frequency (IF) signal wiring line 215c, and at least one first control signal wiring line 215d. The second wiring lines 214a to 214d may include a second LO signal wiring line 214a, at least one second power wiring line 214b, a second IF signal wiring line 214c, and at least one second control signal wiring line 214d.

According to certain embodiments, via the jig 200, one of the first chipset 250 and the second chipset 260 operates in a transmission mode (Tx) that transmits an RF signal, and the other one operates in a reception mode (Rx) that receives an RF signal, whereby the first chipset 250 and the second chipset 260 performs transmission or reception of an RF signal. For example, each of the first chipset 250 and the second chipset 260 may be operated by power supplied from an external power source via the first power wiring line 215b and the second power wiring line 214b.

According to certain embodiments, the first RF signal ports 251 in the first chipset 250 may be set to operate in the transmission mode (e.g., the path of a signal is changed from a reception circuit to a transmission circuit) in response to a control signal, may up-convert a frequency band of an IF signal to an RF signal using an LO signal, and may output the RF signal to an connected port from among the first RF signal ports 251. For example, the control signal may be received by the first chipset 250 from an external calibration device via the first control signal wiring line 215d. The IF signal may be received by the first chipset 250 from an external signal analysis device via the first IF signal wiring line 215c. The LO signal may be received by the first chipset 250 from an external signal generation device via the first LO signal wiring line 215a. In response to a control signal, the first RF signal ports 251 in the first chipset 250 may be set to operate in the reception mode, may receive an RF signal via a connected port, may down-convert the RF signal into an IF using an LO signal, and may output the IF signal to an external signal analysis device via the first IF signal wiring line 214c.

According to certain embodiments, as the first chipset 250 operates in the reception mode, the second chipset 260 operates in the transmission mode. As the first chipset 250 operates in the transmission mode, the second chipset 260 operates in the reception mode. For example, in response to a control signal, the second RF signal ports 261 in the second chipset 260 may be set to operate in transmission mode, may up-convert the frequency band of an IF signal to an RF signal using an LO signal, and may output an RF signal to a connected port among the second RF signal ports 261. The RF signal may be transferred to the first RF signal ports 251 of the first chipset 250 which are set to the reception mode, via the plurality of vias 213. For example, the control signal may be received by the second chipset 260 from an external calibration device via the second control signal wiring line 214d. The IF signal may be received by the second chipset 260 from an external signal analysis device via the second IF signal wiring line 214c. The LO signal may be received by the second chipset 260 from an external signal generation device via the second LO signal wiring line 214a. In response to a control signal, the second RF signal ports 261 in the second chipset 260 may be set to operate in the reception mode, may receive an RF signal from the first RF signal ports 251 of the first chipset 250, which are set to the transmission mode, via a connected port, may down-convert the RF signal into an IF using an LO signal, and may output the IF signal to an external signal analysis device via the second IF signal wiring line 215c.

According to certain embodiments, while one of the first chipset 250 and the second chipset 260 is set to operate in the reception mode and the other one is set to operate in the transmission mode, settings related to operations of the first RF signal ports 251 or the second RF signal ports 261 may be changed according to a designated order for the purpose of testing the transmission or reception performance of the second chipset 260. For example, gain values given to an amplifier and/or phase shift values of a phase shifter included in the first RF signal ports 251 of the first chipset 250 may be changed according to a designated order in response to a first control signal received by the first chipset 250 from an external calibration device via the first control signal wiring line 251d. Gain values given to an amplifier and/or phase shift values included in the second RF signal ports 261 of the second chipset 260 may be changed according to a designated order in response to a second control signal received by the second chipset 260 from a calibration device via the second control signal wiring line 214d.

According to certain embodiments, an error and/or a compensation value obtained on the basis of a test result may be recorded in a memory of a device under test (DUT) which is a subject to be calibrated, via the jig 200. For example, the first chipset 250 is a golden sample of which the RF signal transmission or reception performance is qualified, and the second chipset 260 may be a subject to be calibrated. While the first chipset 250 is set to operate in the reception mode and the second chipset 260 is set to operate in the transmission mode, a first IF signal may be output to a signal analysis device via the first IF signal wiring line 215c. The signal analysis device may analyze the characteristic (e.g., a phase, power, or current) of the first IF signal. The calibration device may obtain an error of an RF signal transmission performance compared to a designated transmission reference, on the basis of the characteristic of the first IF signal, and may obtain a compensation value to enable the RF signal transmission performance to converse to the transmission reference. The obtained "transmission performance error compared to reference" and/or compensation value may be transferred to the second chipset 260 via the second control signal wiring line 214d of the jig 200, and may be recorded in a memory included in the second chipset 260. As another example, while the first chipset 250 is set to operate in the transmission mode and the second chipset 260 is set to operate in the reception mode, a second IF signal may be output to a signal analysis device via the second IF signal wiring line 214c. The signal analysis device may analyze the characteristic of the second IF signal. The calibration device may obtain an error of an RF signal reception performance, compared to a designated reception reference, on the basis of the characteristic of the second IF signal, and may obtain a compensation value to enable the RF signal reception performance to converse to the reception reference. The obtained "reception performance error compared to reference" and/or compensation value may be transferred to the second chipset 260 via the second control signal wiring line 214*d* of the jig 200, and may be recorded in a memory included in the second chipset 260.

According to certain embodiments, the jig 200 may be tested in order to accurately test the second chipset 260. For example, the first chipset 250 and the second chipset 260 may be golden samples which are qualified. When an RF signal is transmitted or received between the first chipset 250 and the second chipset 260, an error (e.g., an error caused by the jig 200) of the transmission or reception performance compared to a reference may be identified, which is caused by the physical characteristic of the jig 200. The error caused by a jig may be utilized when a calibration device tests a DUT.

According to some embodiments, a separate second socket (not illustrated) is disposed in the first side 211 of the PCB 210, and the first chipset 250 is inserted into the second socket. Accordingly, the first chipset 250 may be electrically connected to the first connector 220 and the second chipset 260 via the second socket.

According to an embodiment, the jig 200 may further include a power management integrated circuit (PMIC) (not illustrated). For example, the PMIC may adjust the voltage level or the current level of power supplied from an external power source, so as to generate a plurality of power sources having different voltage levels or different current levels, and may supply the same to the first chipset 250 and the second chipset 260 via power wiring lines.

Figure 3:
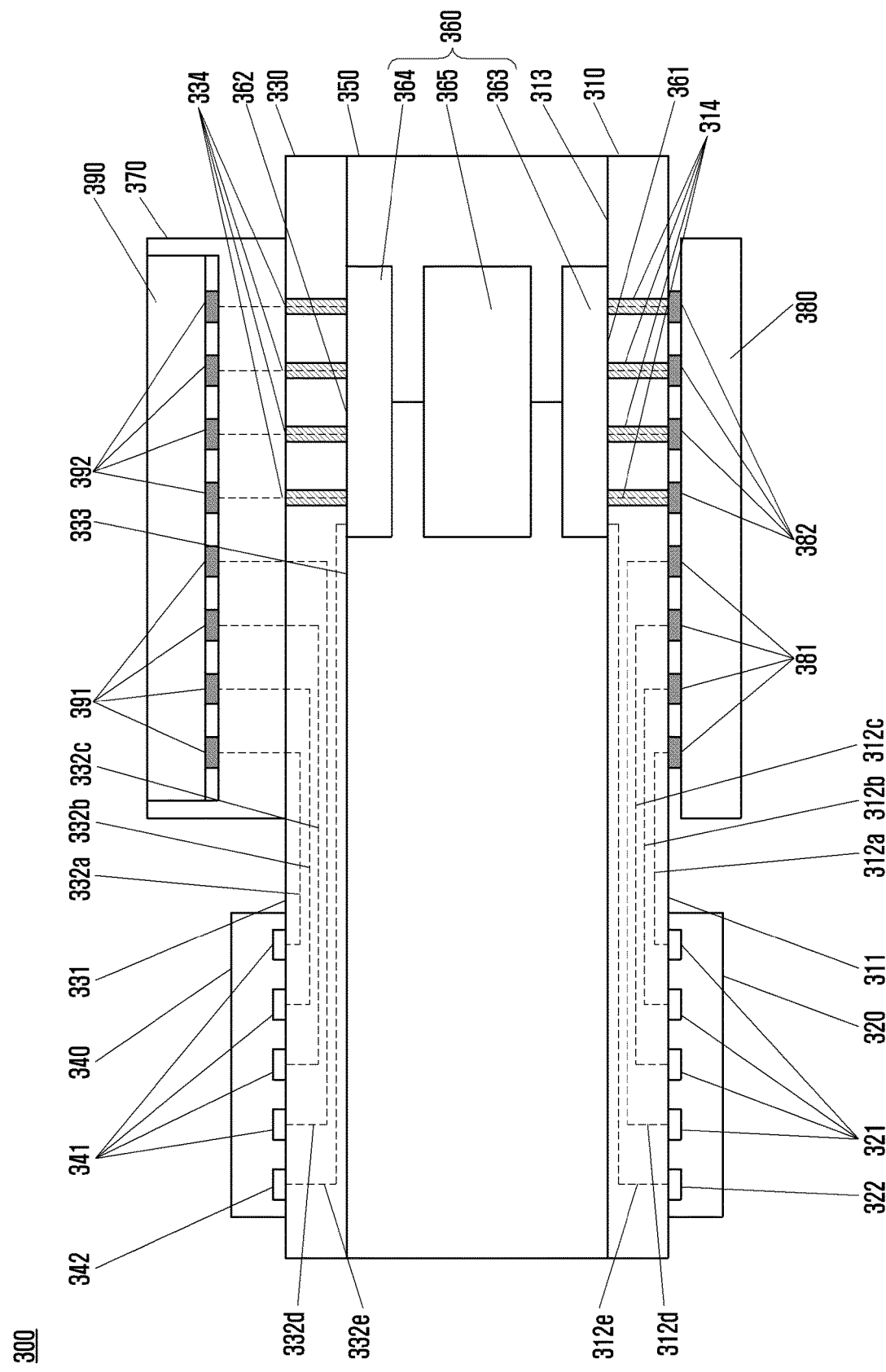
FIG. 3 is a diagram illustrating a jig which has a different structure from that of the jig of FIG. 2, but is used for testing and calibrating a chipset that supports wireless communication in an ultrahigh frequency band (mmwave) like the jig of FIG. 2.

FIG. 3 is a diagram illustrating a jig which has a different structure from that of the jig of FIG. 2, but is used for testing and calibrating a chipset that supports wireless communication in an ultrahigh frequency band (mm wave) like the jig of FIG. 2. The first connector 320 includes a terminal 322 that is directly connected to a first switch 363 by line 312*e*. The second connector 340 includes a terminal 332*e* that is directly connected to a second switch 364 by line 332*e*.

Referring to FIG. 3, a jig 300 according to certain embodiments may include a first PCB 310, a first connector 320, a second PCB 330, a second connector 340, a support structure 350, a connection structure 360, and a socket 370.

According to certain embodiments, the support structure 350 may support a first PCB 310 and a second PCB 330, and may envelope and protect the connection structure 360 disposed between the first PCB 310 and the second PCB 330.

According to certain embodiments, the first PCB 310 may support the first connector 320 and a first chipset 380. The first connector 320 and the first chipset 380 may be disposed in one side 311 of the first PCB 310.

According to certain embodiments, the first PCB 310 electrically connects the first chipset 380 to the first connector 320, such that an external device may exchange a signal with the first chipset 380 via the first connector 320. For example, the first PCB 310 includes a plurality of first wiring lines 312*a* to 312*e* for electrically connecting the first ports 381 of the first chipset 380 to terminals 321 of the first connector 320. The plurality of first wiring lines 312*a* to 312*e* may include a first LO signal wiring line 312*a*, at least one first power wiring line 312*b*, a first IF signal wiring line 312*c*, and at least one first control signal wiring line 312*d*.

According to certain embodiments, the first PCB 310 may electrically connect the first chipset 380 to the connection structure 360, such that the first chipset 380 and the second chipset 390 may perform RF signal transmission or reception via the connection structure 360. For example, the plurality of vias 314 that passes through the first side 311 and the second side 313 of the PCB 310 may be disposed in the first PCB 310. The plurality of vias 314 may be in contact with the first RF signal ports 382 of the first chipset 380, and the plurality of vias 314 may be in contact with a first end 361 of the connection structure 360. Accordingly, the first RF signal ports 382 may be electrically connected to the connection structure 360 via the first PCB 310.

According to certain embodiments, the first PCB 310 electrically connects the first connector 320 to the connection structure 360, such that an external device controls the connection structure 360 via the first connector 320. For example, at least one first connection control wiring line 312*e* that connects the terminal 322 of the first connector 320 to the connection structure 360 may be further included in the plurality of first wiring lines 312*a* to 312*e*.

According to certain embodiments, the second PCB 330 may support the second connector 340 and the socket 370. The second connector 340 and the socket 370 may be disposed in a third side 331 of the second PCB 330.

According to certain embodiments, the second PCB 330 electrically connects the socket 370 to the second connector 340, such that an external device may exchange a signal with the second chipset 390 inserted into the socket 370, via the second connector 340. For example, a plurality of second wiring lines 332*a* to 332*e* for electrically connecting the second ports 391 of the second chipset 390 to terminals 341 of the second connector 340 may be included in the second PCB 330. The plurality of second wiring lines 332*a* to 332*e* may include a second LO signal wiring line 332*a*, at least one second power wiring line 332*b*, a second IF signal wiring line 332*c*, and at least one second control signal wiring line 332*d*.

According to certain embodiments, the second PCB 330 may electrically connect the second chipset 390 to the connection structure 360, such that the first chipset 380 and the second chipset 390 may perform RF communication via the connection structure 360. For example, the plurality of vias 334 that passes through the third side 331 and a fourth side 333 of the second PCB 330 may be disposed in the second PCB 330. The plurality of vias 334 may be in contact with the second RF signal ports 392 of the second chipset 390, and the plurality of vias 334 may be in contact with a second end 362 of the connection structure 360. Accordingly, the second RF signal ports 392 may be electrically connected to the connection structure 360 via the second PCB 330.

According to certain embodiments, the second PCB 330 electrically connects the second connector 340 to the connection structure 360, such that an external device controls the connection structure 360 via the second connector 340. For example, a second connection control wiring line 332*e* that connects the terminal 342 of the second connector 340 to the connection structure 360 may be further disposed in the second PCB 330 as a component of the second wiring lines 332*a* to 332*e*.

According to certain embodiments, the connection structure 360 electrically connects one of the first RF signal ports 382 to one of the second RF signal ports 392, such that one of the first RF signal ports 382 of the first chipset 380 and one of the second RF signal ports 392 of the second chipset 390 perform RF communication. For example, the connection structure 360 may include a first switch 363 disposed in the first end 361, a second switch 364 disposed in the second end 362, and a waveguide 365 disposed between the first switch 363 and the second switch 364. The first switch 363 is an electronic component that selects one of the first RF signal ports 382 and electrically connects the selected port to the waveguide 365, and the first switch 363 is controlled by an external calibration device connected to the first switch 363 via the first connection control wiring line 312e. The second switch 364 is an electronic component that selects one of the second RF signal ports 392 and electrically connects the selected port to the waveguide 365, and the second switch 364 is controlled by an external calibration device connected to the second switch 364 via the second connection control wiring line 332e.

According to some embodiments, a separate second socket (not illustrated) is disposed in the first side 311 of the first PCB 310, and the first chipset 380 is inserted into the second socket. Accordingly, the first chipset 380 may be electrically connected to the first connector 320 and the second chipset 390 via the second socket.

According to an embodiment, the jig 300 may further include a power management integrated circuit (PMIC) (not illustrated). For example, the PMIC may adjust the voltage level or the current level of power supplied from an external power source, so as to generate a plurality of power sources having different voltage levels or different current levels, and may supply the same to the first chipset 380 and the second chipset 390 via power wiring lines.

Figure 4:
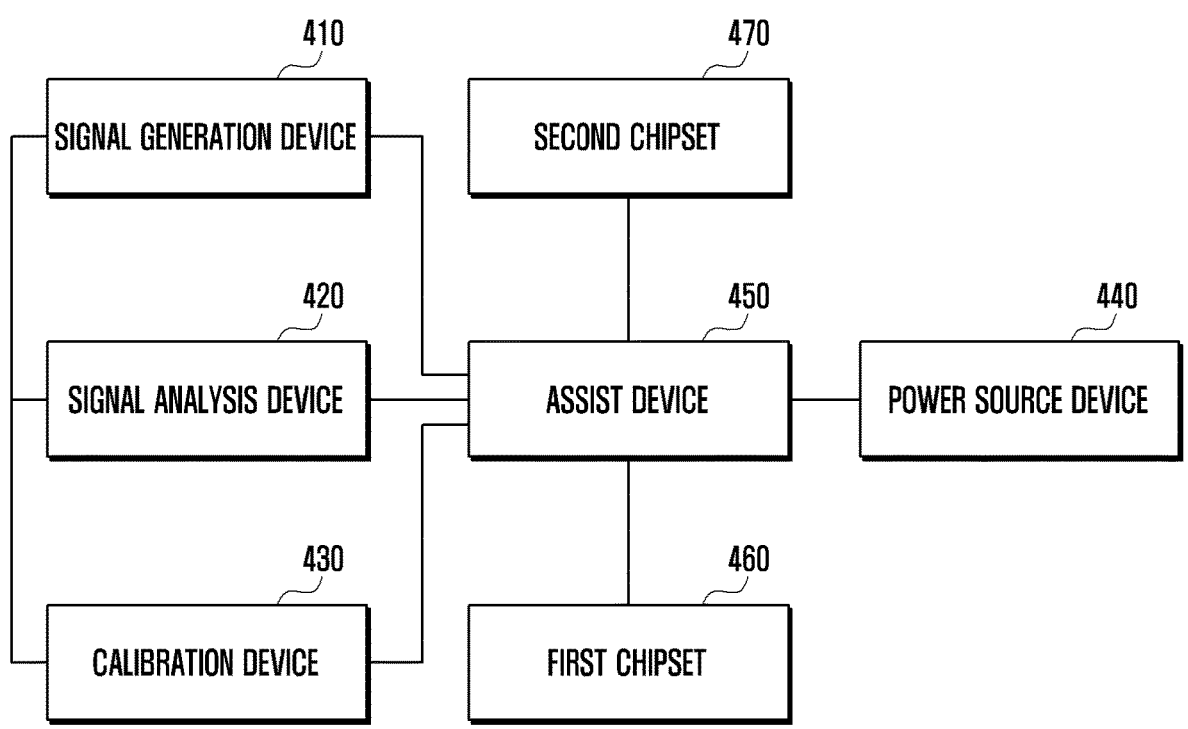
FIG. 4 is a diagram illustrating a system for testing and calibrating a chipset that supports wireless communication in an ultrahigh frequency band (mmwave) according to certain embodiments.

FIG. 4 is a diagram illustrating a system for testing and calibrating a chipset that supports wireless communication in an ultrahigh frequency band (mmwave) according to certain embodiments.

Referring to FIG. 4, a system according to certain embodiments may include a signal generation device 410, a signal analysis device 420, a calibration device 430, a power source device 440, an assist device 450, a first chipset 460, and a second chipset 470.

According to certain embodiments, the assist device 450 includes, for example, the jig 200 of FIG. 2 or the jig 300 of FIG. 3. The assist device 450 may be a medium that enables the first chipset 460 and the second chipset 470 to perform RF signal transmission or reception. As another example, the assist device 450 may electrically connect the signal generation device 410, the signal analysis device 420, the calibration device 430, and the power source device 440 to the first chipset 460 and the second chipset 470.

According to certain embodiments, the power source device 440 may supply power to the first chipset 460 and the second chipset 470 via the assist device 450.

According to certain embodiments, the signal generation device 410 may generate an LO signal according to the control of the calibration device 430. An LO signal may be transmitted from the signal generation device 410 to the first chipset 460 or the second chipset 470 via the assist device 450, depending on whether the transmission or reception is set.

According to certain embodiments, the signal generation device 410 may generate an IF signal according to the control of the calibration device 430. An IF signal may be transmitted from the signal generation device 410 to the first chipset 460 or the second chipset 470 via the assist device 450.

According to certain embodiments, the signal analysis device 420 may receive an IF signal from the first chipset 460 or the second chipset 470 via the assist device 450, may analyze the characteristic of the IF signal, and may transmit an analysis result to the calibration device 430. For example, the signal analysis device 420 may include a spectrum analyzer that is capable of analyzing the frequency and power of an IF signal. As another example, the signal analysis device 420 may include a vector network analyzer (VNA) that is capable of analyzing a phase, in addition to the power and the frequency of an IF signal.

According to certain embodiments, the calibration device 430 may be configured to include elements which perform the same functions as those of at least some (e.g., the processor 120, the memory 130, the program 140, the input device 150, the display device 160, the interface 177, or the connection terminal 178) of the elements included in the electronic device 101 of FIG. 1. For example, the calibration device 430 may be configured to include a memory, a processor, and an interface that connects the processor to the signal generation device 410, the signal analysis device 420, and the assist device 450.

According to certain embodiments, the calibration device 430 may be configured to perform: controlling such that one of the first chipset 460 and the second chipset 470 operates in the transmission mode, and the other one operates in the reception mode; controlling the signal generation device 410 so as to generate an LO signal; controlling the signal generation device 410 so as to generate and transmit an IF signal to a chipset that operates in the transmission mode; obtaining an "RF signal transmission or reception performance error compared to reference" that a DUT (e.g., second chipset 470) has, using the characteristic information received from the signal analysis device 420; obtaining a compensation value to enable the transmission or reception performance to converge to the reference, using the obtained error; and recording the obtained error and/or compensation value in the DUT.

According to certain embodiments, the memory of the calibration device 430 may store instructions that enable the calibration device 430 to perform the operations, when the instructions are executed by the processor of the calibration device 430.

In certain embodiments, the signal generation device 410 can generate an IF signal that is received by first connector 220/320 via port 221/321 and transmitted on line 215c/312c to a first port 252/381 of the first chipset 250/380/460. The first chipset 250/380 can convert the IF signal to an RF signal and transmit the RF signal to the second chipset 260/390. The second chipset 260/390 can convert the RF signal to an IF signal. The IF signal can be transmitted to the second connector 230/340 via signal line 214c/332c. The signal analysis device 420 can compare the IF signal that is received to the IF signal generated by the signal generation device 410. Based on the comparison, the calibration device 430 can calibrate or compensate the second chipset 470.

Figure 5:
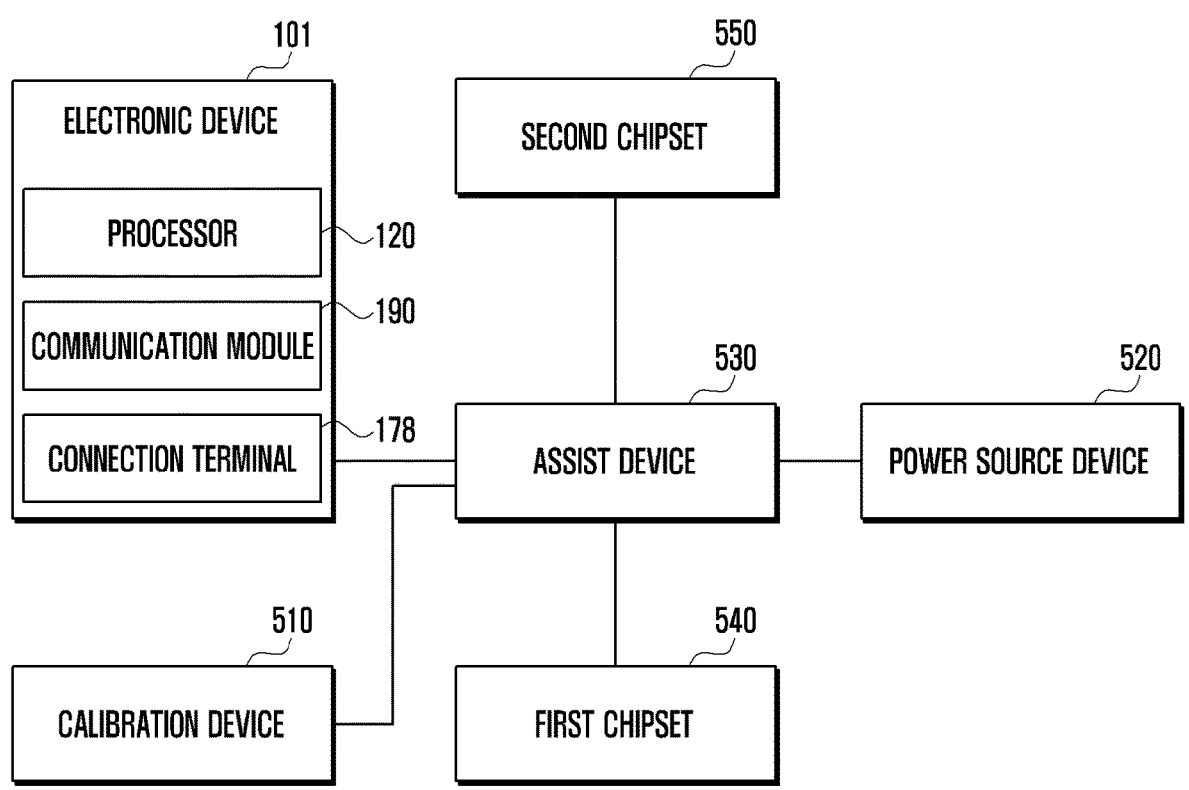
FIG. 5 is a diagram illustrating a system, some components of which are different from those of the system of FIG. 4, but is used for testing and calibrating a chipset that supports wireless communication in an ultrahigh frequency band (mmwave), like the system of FIG. 4.

In certain embodiments, the signal generation device 410 can generate an IF signal that is received by second connector 230/340 and transmitted on line 214c/332c to a second chipset 260/390/470. The second chipset 260/390/470 can convert the IF signal to an RF signal and transmit the RF signal to the first chipset 250/380/460. The first chipset 250/380/460 can convert the RF signal to an IF signal. The IF signal can be transmitted to the first connector 220/320 via signal line 215c/312c. The signal analysis device 420 can compare the IF signal that is received to the IF signal generated by the signal generation device 410. Based on the comparison, the calibration device 430 can calibrate or compensate the second chipset 470. FIG. 5 is a diagram illustrating a system, some components of which are different from those of the system of FIG. 4, but is used for testing and calibrating a chipset that supports wireless communication in an ultrahigh frequency band (mmwave), like the system of FIG. 4.

Referring to FIG. 5, a system according to certain embodiments may include the electronic device 101, a calibration device 510, a power source device 520, an assist device 530, a first chipset 540, and a second chipset 550.

According to certain embodiments, the assist device 530 may be the substantially the same as the assist device 450 of FIG. 4, and may perform the same function.

According to certain embodiments, the electronic device 101 may be configured to perform the substantially the same operation as that of the signal generation device 410 and the signal analysis device 420 of FIG. 4. For example, the communication module 190 may be electrically connected to the calibration device 510 and the assist device 530 via the connection terminal 178. The communication module 190 may generate an LO signal according to the control of the calibration device 510, and may transmit the same to the first chipset 540 and the second chipset 550 via the assist device 530. As another example, the communication module 190 may generate an IF signal according to the control of the calibration device 510, and may transmit the same to the first chipset 540 and the second chipset 550 via the assist device 530. As another example, the communication module 190 may receive an IF signal from the first chipset 540 or the second chipset 550 via the assist device 530, and may transfer the IF signal to the processor 120 (e.g., CP). The processor 120 may obtain the characteristic of the IF signal, and may transmit the same to the calibration device 510.

According to certain embodiments, the assist device 510 may have the substantially the same configuration as that of the assist device 430 of FIG. 4, and may perform substantially the same function.

Figure 6:
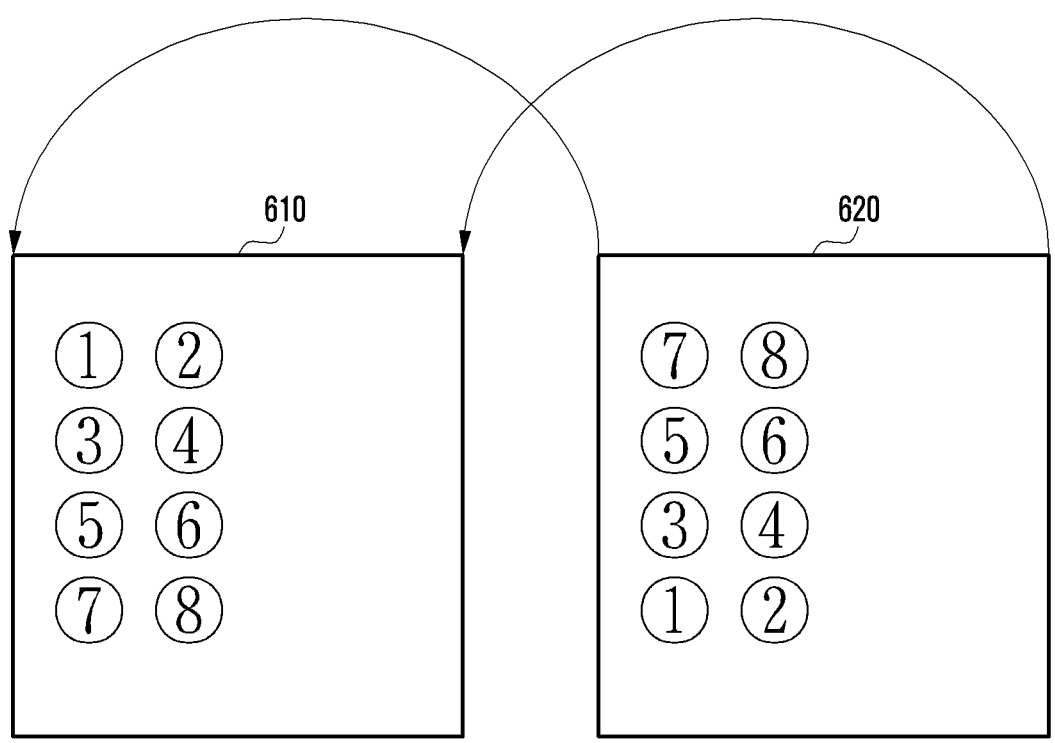
FIG. 6 is a diagram illustrating a one-to-one relationship between first RF signal ports of a first chipset and second RF signal ports of a second chipset when the first chipset and the second chipset are disposed in a jig according to certain embodiments.

FIG. 6 is a diagram illustrating a one-to-one relationship between first RF signal ports of a first chipset and second RF signal ports of a second chipset when the first chipset and the second chipset are disposed in a jig (e.g., the jig 200 of FIG. 2 or jig 300 of FIG. 3) according to certain embodiments.

Referring to FIG. 6, the first RF signal ports of the first chipset 610 and the second RF signal ports of the second chipset 620 are in a one-to-one relationship. For example, an identifier (e.g., a number) may be assigned to an RF signal port for identification, and a table showing the one-to-one relationship, such as Table 1, may be stored in a calibration device (e.g., the calibration device 430 of FIG. 4 or the calibration device 510 of FIG. 5).

According to certain embodiments, the calibration device (e.g., the calibration device 430 of FIG. 4 or the calibration device 510 of FIG. 5) may recognize the one-to-one electrical connection between the first RF signal ports of the first chipset 610 and the second RF signal ports of the second chipset 620 on the basis of a table such as Table 1, when all of the chipsets 610 and 620 are configured to be golden samples and physical characteristic of a jig is tested, or when one of the chipsets 610 and 620 is configured to be a golden sample and the other one is configured to be a DUT and a DUT is tested and calibrated.

TABLE 1

| Port number (first chipset) | Port number (second chipset) |
| --- | --- |
| 1 | 8 |
| 2 | 7 |
| 3 | 6 |
| 4 | 5 |
| 5 | 4 |
| 6 | 3 |
| 7 | 2 |
| 8 | 1 |

Figure 7:
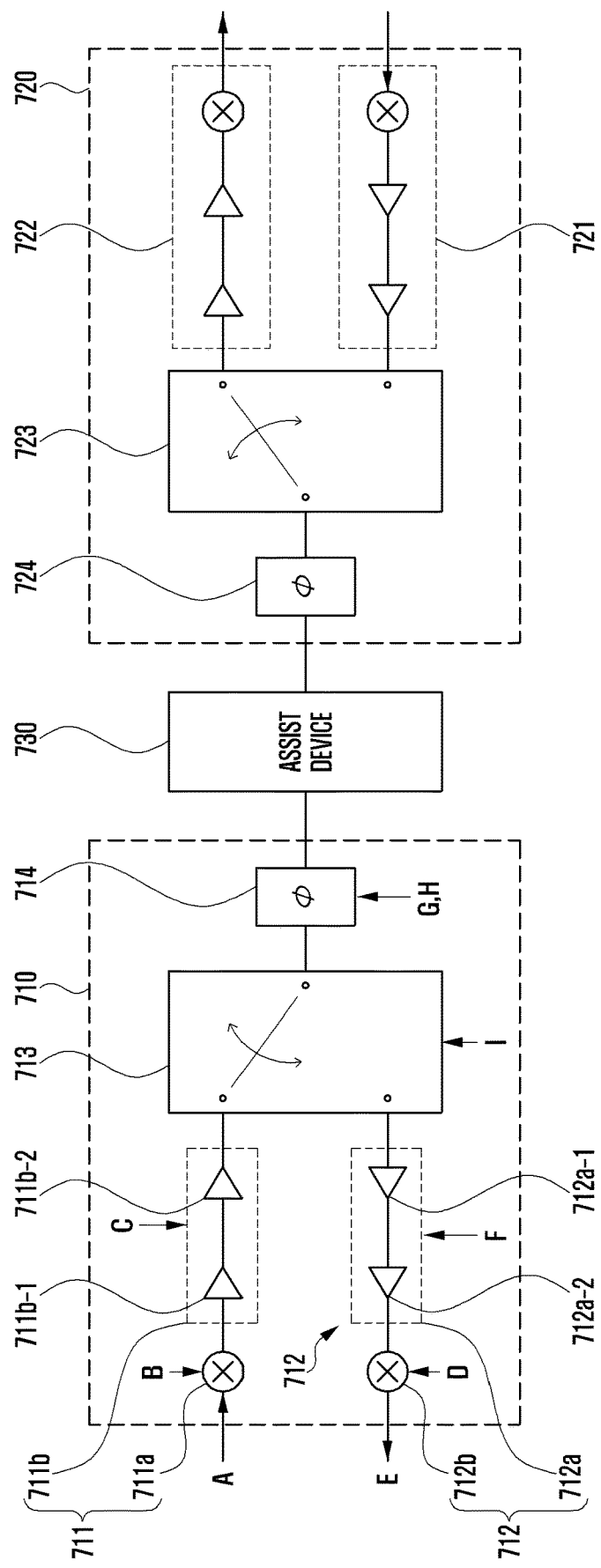
FIG. 7 is a diagram illustrating RF signal transmission or reception performed between RF signal ports using an assist device according to certain embodiments.

FIG. 7 is a diagram illustrating RF signal transmission or reception performed between RF signal ports using an assist device according to certain embodiments.

Referring to FIG. 7, according to certain embodiments, a first RF signal port 710 and a second RF signal port 720 are elements of the first chipset and the second chipset which are electrically connected to each other via an assist device 730 (e.g., the assist device 450 of FIG. 4 or the assist device 530 of FIG. 5), and may exchange an RF signal via the assist device 730. In certain embodiments, port 710 can correspond to a port 251/362, while port 720 can correspond to a port 261/392.

According to certain embodiments, the first RF signal port 710 may include a first RF transmission circuit 711, a first RF reception circuit 712, a first switch 713, and a first phase shifter 714.

According to certain embodiments, the first RF transmission circuit 711 may up-convert an IF signal A received from an external device to a designated RF frequency, and may amplify and output an RF signal. For example, the first RF transmission circuit 711 may be configured to include a mixer 711a and an amplification circuit 711b. The mixer 711a may receive the IF signal A from a signal generation device (e.g., the signal generation device 410 of FIG. 4 or the electronic device 101 of FIG. 5) via the assist device 730, may receive an LO signal B from the signal generation device (e.g., the signal generation device 410 of FIG. 4 or the electronic device 101 of FIG. 5), may generate an RF signal by mixing them, and may output the RF signal to the amplification circuit 711b. The amplification circuit 711b may include a driver amplifier 711b_1 for primarily amplifying an RF signal received from the mixer 711a, or a power amplifier 711b_2 for amplifying an RF signal received from the driver amplifier 711b_1 and outputting the same to the second RF signal port 720 via the assist device 730.

According to certain embodiments, a gain of the amplification circuit 711b may be changed. For example, the gain may indicate a ratio of "power of an RF signal amplified and output by the amplification circuit 711b" to "power of an RF signal input to the amplification circuit 711b". A gain of at least one of the driver amplifier 711b_1 and the power amplifier 711b_2 of the amplification circuit 711b may be changed by a control signal C received from an external device (e.g., the calibration device 430 of FIG. 4 or the calibration device 510 of FIG. 5) via the assist device 730, such that the amplification circuit 711b may amplify the RF signal to have a designated gain.

According to certain embodiments, the first RF reception circuit 712 may amplify an RF signal received from an external device, may down-convert the amplified RF signal to a designated IF frequency, and may output the same. For example, the first RF reception circuit 712 may include an amplification circuit 712a and a mixer 712b. The amplification circuit 712a may include a low noise amplifier 712a_1 for low-noise amplifying an RF signal received from the second RF signal port 720 via the assist device 730, or a variable gain amplifier 712a_2 for amplifying the low-noise amplified RF signal to have a designated gain, and outputting the same to the mixer 712b. The mixer 712b may receive an LO signal D from the signal generation device (e.g., the signal generation device 410 of FIG. 4 or the electronic device 101 of FIG. 5), may mix an RF signal received from the amplification circuit 712a and the LO signal D so as to generate an IF signal E, and may output the IF signal E to the signal analysis device (e.g., the signal analysis device 420 of FIG. 4 or the electronic device 101 of FIG. 5) via the assist device 730. The amplification circuit 712a of the first RF reception circuit 712 and the gain thereof may be changed by a control signal F received from an external device via the assist device 730.

According to certain embodiment, a first phase shifter 714 shifts the phase of an RF signal received from the second RF signal port 720 via the assist device 730 to a designated phase on the basis of a control signal G, and may output the phase-sifted RF signal to the first RF reception circuit 712. Also, the first phase shifter 714 shifts the phase of an RF signal received from the first RF transmission circuit 711 to a designated phase on the basis of a control signal H, and may output the phase-sifted RF signal to the second RF signal port 720 via the assist device 730. Here, the control signals G and H may be received by the first phase shifter 714 from the calibration device (e.g., the calibration device 430 of FIG. 4 or the calibration device 510 of FIG. 5) via the assist device 730.

According to certain embodiments, the first switch 713 may change the operation mode of the first RF signal port 710 from the reception mode to the transmission mode, and vice versa. For example, the first switch 713 may receive a control signal I from the calibration device (e.g., the calibration device 430 of FIG. 4 or the calibration device 510 of FIG. 5) via the assist device 730, and may connect the first phase shifter 714 to one of the first RF reception circuit 712 and the first RF transmission circuit 711 according to the control signal I.

According to certain embodiments, the second RF signal port 720 may include a second RF transmission circuit 721, a second RF reception circuit 722, a second switch 723, and a second phase shifter 724. Each element may perform substantially the same function as that of each element of the first RF signal port 710.

According to certain embodiments, in the state in which both the first RF signal port 710 and the second RF signal port 720 are golden samples, the assist device 730 may be tested. For example, in the state in which one of the first RF signal port 710 and the second RF signal port 720 is set to operate in the reception mode, and the other one is set to operate in the transmission mode, as settings (e.g., a gain, a phase shift value, or the like) related to operations of the first RF signal port 710 and the second RF signal port 720 are changed according to a designated order, a so-called sweep operation that obtains a change (e.g., a change in the characteristic caused by a change of the settings) in the characteristic (e.g., amplitude, frequency, phase, or power) of an IF signal output from "an inspection set including the first RF signal port 710, the assist device 730, and the second RF signal port 720" may be performed by the calibration device. For example, when it is assumed that a gain of each amplification circuit is changed based on three levels, and a phase shift value is changed based on two levels, the setting of the first RF signal port 710 may be changed 6(=3*2) times, and in the same manner, the setting of the second RF signal port 720 may be changed 6 times. For example, while the first RF signal port 710 operates in the transmission mode and the second RF signal port 720 operates in the reception mode, the setting may be changed 36(=6*6) times. In the opposite case, the setting may be changed 36(=6*6). Accordingly, the setting may be changed a total of 72 times. The calibration device may change a setting a total of 72 times according to a designated order, may obtain an error compared to a designated reference, on the basis of a change in the characteristic of an IF signal output every time the setting is changed, and may use the obtained error for testing and calibrating a DUT.

According to certain embodiments, in the state in which one of the first RF signal port 710 and the second RF signal port 720 is a golden sample and the other one is a DUT, the DUT may be tested and calibrated. For example, in the state in which a golden sample is set to operate in the transmission mode and the DUT is set to operate in the reception mode, the first sweep operation may be performed by the calibration device. The calibration device may obtain a "reception performance error compared to a designated reference" of the DUT and/or a compensation value on the at least basis of the data obtained via the first sweep operation (additionally, on the further basis of an error caused by a jig), and may record the error and/or compensation value in the DUT via the assist device 730. On the basis of data obtained from a second sweep operation performed in the state in which the golden sample is set to operate in the reception mode and the DUT is set to operate in the transmission mode, a "transmission performance error compared to a designated reference" of the DUT and/or a compensation value may be obtained and may be recorded in the DUT.

In certain embodiments, a first compensation value can be a parameter associated with the phase shifter 714, gain of amplifiers 711, 712, and mixers 711.

Figure 8:
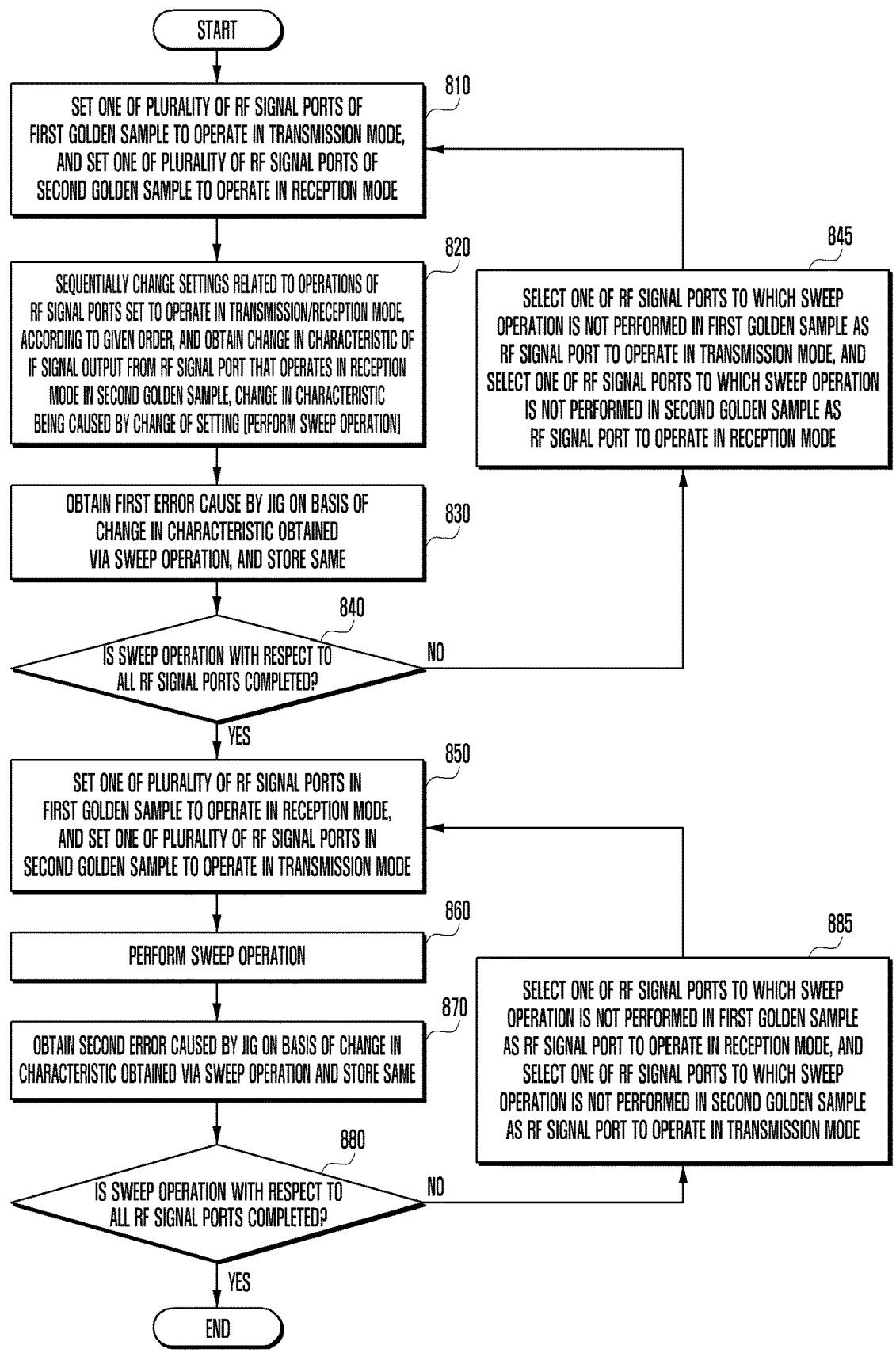
FIG. 8 is a flowchart illustrating a process for obtaining an error caused by an assist device when test and calibration is performed with respect to a chipset that supports wireless communication in an ultrahigh frequency band, according to certain embodiments.

FIG. 8 is a flowchart illustrating a process for obtaining an error caused by an assist device when test and calibration is performed with respect to a chipset that supports wireless communication in an ultrahigh frequency band, according to certain embodiments. In this case, both the first chipset and the second chipset are gold standard or golden samples, so all errors are attributable to faults in the jig.

According to certain embodiments, the process of FIG. 8 may be executed by the calibration device 430 in the state in which both the first chipset 460 and the second chipset 470 are golden samples in the system of FIG. 4, or the processor of FIG. 8 may be executed by the calibration device 510 in the state in which the both the first chipset 540 and the second chipset 550 are golden samples in the system of FIG. 5.

According to certain embodiments, in operation 810, the calibration device may set one of the first RF signal ports (e.g., the first RF signal ports 382 of FIG. 3) included in a first golden sample to operate in the transmission mode, and may set one of the second RF signal ports (e.g., the second RF signal ports 392 of FIG. 3) included in a second golden sample to operate in the reception mode. For example, when it is assumed that the first RF signal port 710 of FIG. 7 is included in the first golden sample and the second RF signal port 720 of FIG. 7 is included in the second golden sample, the calibration device may control the first switch 713 such that the first phase shifter 714 is connected to the first RF transmission circuit 711, and may control a signal analysis device and a signal generation device so as to output an IF signal and an LO signal to the first RF transmission circuit 711, thereby setting the first RF signal port 710 of the first golden sample to operate in the transmission mode. As another example, the calibration device controls the second switch 723 such that the second phase shifter 724 is connected to the second RF reception circuit 721, and may control the signal generation device to output an LO signal to the second RF reception circuit 722, thereby setting the second RF signal port 720 of the second golden sample to operate in the reception mode. According to an embodiment, the calibration device may use a table such as Table 1 when selecting an RFIC of the second golden sample corresponding to an RFIC of the first golden sample.

According to certain embodiments, in operation 820, the calibration device changes settings related to the operation of the first RF signal port set to operate in the transmission or reception mode, according to a designated order, and may perform a sweep operation that obtains, via the signal analysis device, a change in the characteristic of an IF signal output from the second RF signal port that operates in the reception mode in the second golden sample, the change being caused by the change of the setting.

According to certain embodiments, in operation 830, the calibration device obtains "a first error caused by a jig when the first golden sample is in the transmission mode" from the change in the characteristic obtained via the sweep operation, and store the obtained error (e.g., in the memory of the calibration device).

According to certain embodiments, in operation 840, the calibration device may determine whether the sweep operation with respect to the first RF signal ports or the second RF signal ports is completed. When a first RF signal port or a second RF signal port to which the sweep operation is not performed exists, the calibration device may select one of the first RF signal ports to which the sweep operation is not performed in the first golden sample as a first RF signal port to operate in the transmission mode, and may select one of the second RF signal ports to which the sweep operation is not performed in the second golden sample as a second RF signal port to operate in the reception mode in operation 845, and may perform operations 810, 820, and 830 again.

When the sweep operation (e.g., the sweep operation on the basis that the first golden sample is in the transmission mode) is completed with respect to the first RF signal ports or the second RF signal ports, the process may be terminated. According to embodiments, alternatively or additionally, a sweep operation on the basis that the first golden sample is in the reception mode may be performed.

According to certain embodiments, in operation 850, the calibration device may set one of the first RF signal ports included in the first golden sample to operate in the reception mode, and may set one of the second RF signal ports included in the second golden sample to operate in the transmission mode.

According to certain embodiments, in operation 860, the calibration device changes settings related to the operations of the first RF signal ports or the second RF signal ports set to operate in the transmission or reception mode, according to a designated order, and may perform a sweep operation that obtains, via the signal analysis device, a change in the characteristic of an IF signal output from the first RF signal port that operates in the reception mode in the first golden sample, the change being caused by the change of the setting.

According to certain embodiments, in operation 870, the calibration device obtains "a second error caused by a jig when the first golden sample is in the reception mode" from the change in the characteristic obtained via the sweep operation, and store the obtained error (e.g., in the memory of the calibration device).

According to certain embodiments, in operation 880, the calibration device may determine whether the sweep operation with respect to the first RF signal ports or the second RF signal ports is completed. When a first RF signal port or a second RF signal port to which the sweep operation is not performed exists, the calibration device may select one of the first RF signal ports to which the sweep operation is not performed in the first golden sample as a first RF signal port to operate in the reception mode, and may select one of the second RF signal ports to which the sweep operation is not performed in the second golden sample as a second RF signal port to operate in the transmission mode in operation 885, and may perform operations 850, 860, and 870 again.

Accordingly, the jig can be calibrated and compensated to provide minimal errors during transmission.

Figure 9:
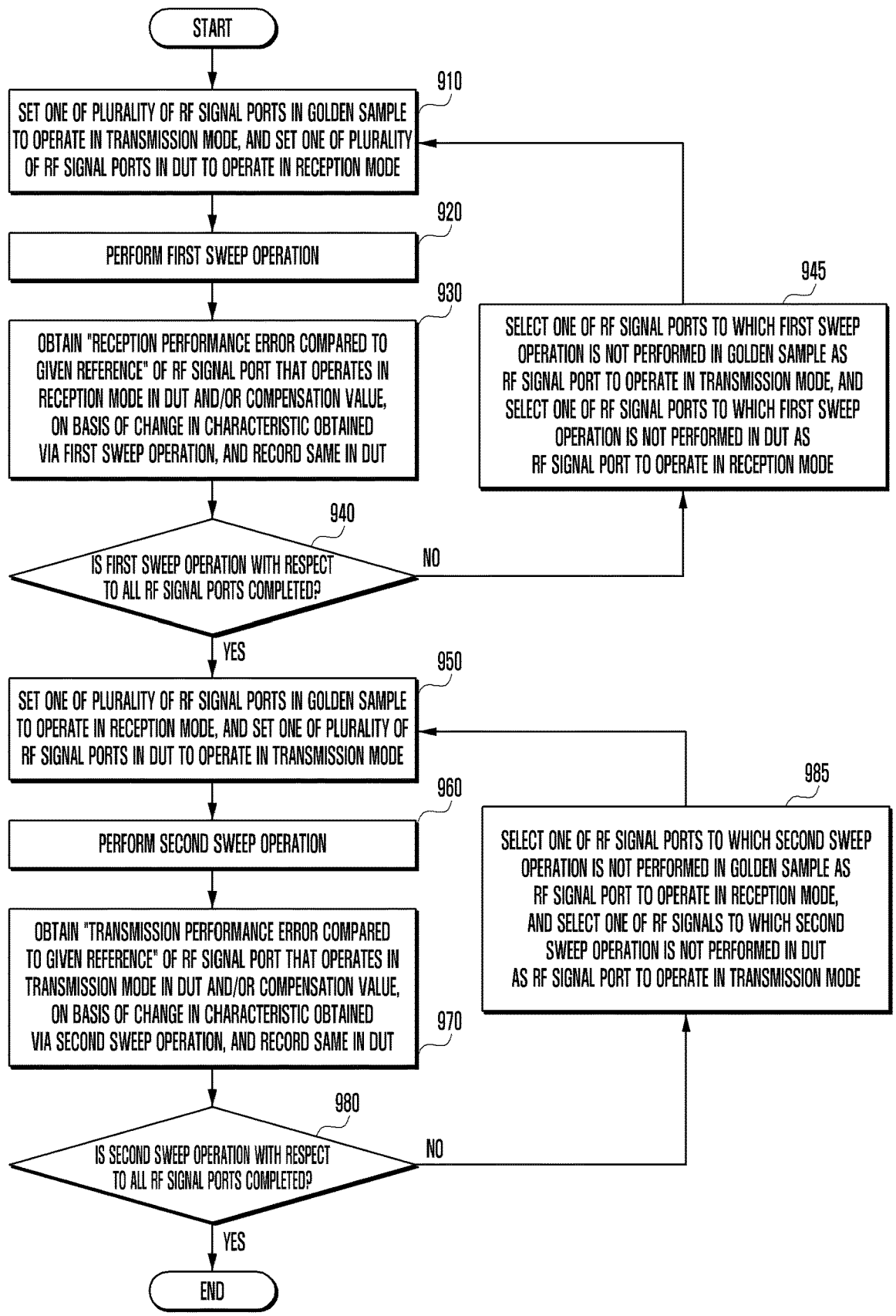
FIG. 9 is a flowchart illustrating a process of testing and calibrating a chipset that supports wireless communication of an ultrahigh frequency band according to certain embodiments.

FIG. 9 is a flowchart illustrating a process of testing and calibrating a chipset that supports wireless communication of an ultrahigh frequency band according to certain embodiments. One of the chipsets is the gold standard or golden sample, and the jig has been tested, calibrated, and corrected. Thus, all errors are isolated to the other chipset.

According to certain embodiments, the process of FIG. 9 may be executed by the calibration device 430 in the state in which one of the first chipset 460 and the second chipset 470 is configured to be a golden sample and the other one is configured a DUT in the system of FIG. 4, or the processor of FIG. 9 may be executed by the calibration device 510 in the state in which one of the first chipset 540 and the second chipset 550 is configured to be a golden sample and the other one is configured to be a DUT in the system of FIG. 5.

According to certain embodiments, in operation 910, the calibration device may set one of the first RF signal ports included in the golden sample to operate in the transmission mode and set one of the second RF signal ports included in the DUT to operate in the reception mode.

According to certain embodiments, in operation 920, the calibration device changes settings of the first RF signal ports or the second RF signal ports set to operate in the transmission or reception mode, according to a designated order, and may perform a first sweep operation that obtains, via a signal analysis device, a change in the characteristic of an IF signal output from an RFIC that operates in the reception mode in the DUT, the change being caused by the change of the setting.

According to certain embodiments, in operation 930, from the change in the characteristic obtained via the first sweep operation, the calibration device may obtain "a reception performance error compared to a designated reference" of the second RF signal port that operates in the reception mode in the DUT and/or a compensation value, and may record the error and/or compensation value in the DUT via the assist device.

According to certain embodiments, in operation 940, the calibration device may determine whether the first sweep operation with respect to all of the first RF signal ports or the second RF signal ports is completed. When a first RF signal port or a second RF signal port to which the first sweep operation is not performed exists, the calibration device may select one of the first RF signal ports to which the first sweep operation is not performed in the golden sample as a first RF signal port to operate in the transmission mode, and may select one of the second RF signal ports to which the first sweep operation is not performed in the DUT as a second RF signal port to operate in the reception mode in operation 945, and may perform operations 910, 920, and 930 again.

When the first sweep operation (e.g., a sweep operation in the case of golden sample_transmission mode/DUT_reception mode) with respect to all of the first RF signal ports or the second RF signal ports is completed, a second sweep operation in the case of golden sample_reception mode/DUT_transmission mode may be performed. According to an embodiment, the second sweep operation may be performed first.

According to certain embodiments, in operation 950, the calibration device may set one of the first RF signal ports included in the golden sample to operate in the reception mode and may set one of the second RF signal ports included in the DUT to operate in the transmission mode.

According to certain embodiments, in operation 960, the calibration device changes settings related to the operations of the first RF signal ports or the second RF signal ports set to operate in the transmission or reception mode, according to a designated order, and may perform the second sweep operation that obtains, via the signal analysis device, a change in the characteristic of an IF signal output from the first RF signal port that operates in the reception mode in the golden sample, the change being caused by the change of the setting.

According to certain embodiments, in operation 970, from the change in the characteristic obtained via the second sweep operation, the calibration device may obtain "a transmission performance error compared to a designated reference" of the second RF signal port that operates in the transmission mode in the DUT and/or a compensation value, and may record the error and/or compensation value in the DUT via the assist device.

According to certain embodiments, in operation 940, the calibration device may determine whether the second sweep operation with respect to all of the first RF signal ports or the second RF signal ports is completed. When a first RF signal port or a second RF signal port to which the sweep operation is not performed exists, the calibration device may select one of the first RF signal ports to which the second sweep operation is not performed in the golden sample as a first RF signal port to operate in the reception mode, and may select one of the second RF signal ports to which the second sweep operation is not performed in the DUT as a second RF signal port to operate in the transmission mode in operation 945, and may perform operations 950, 960, and 970 again.

Figure 10:
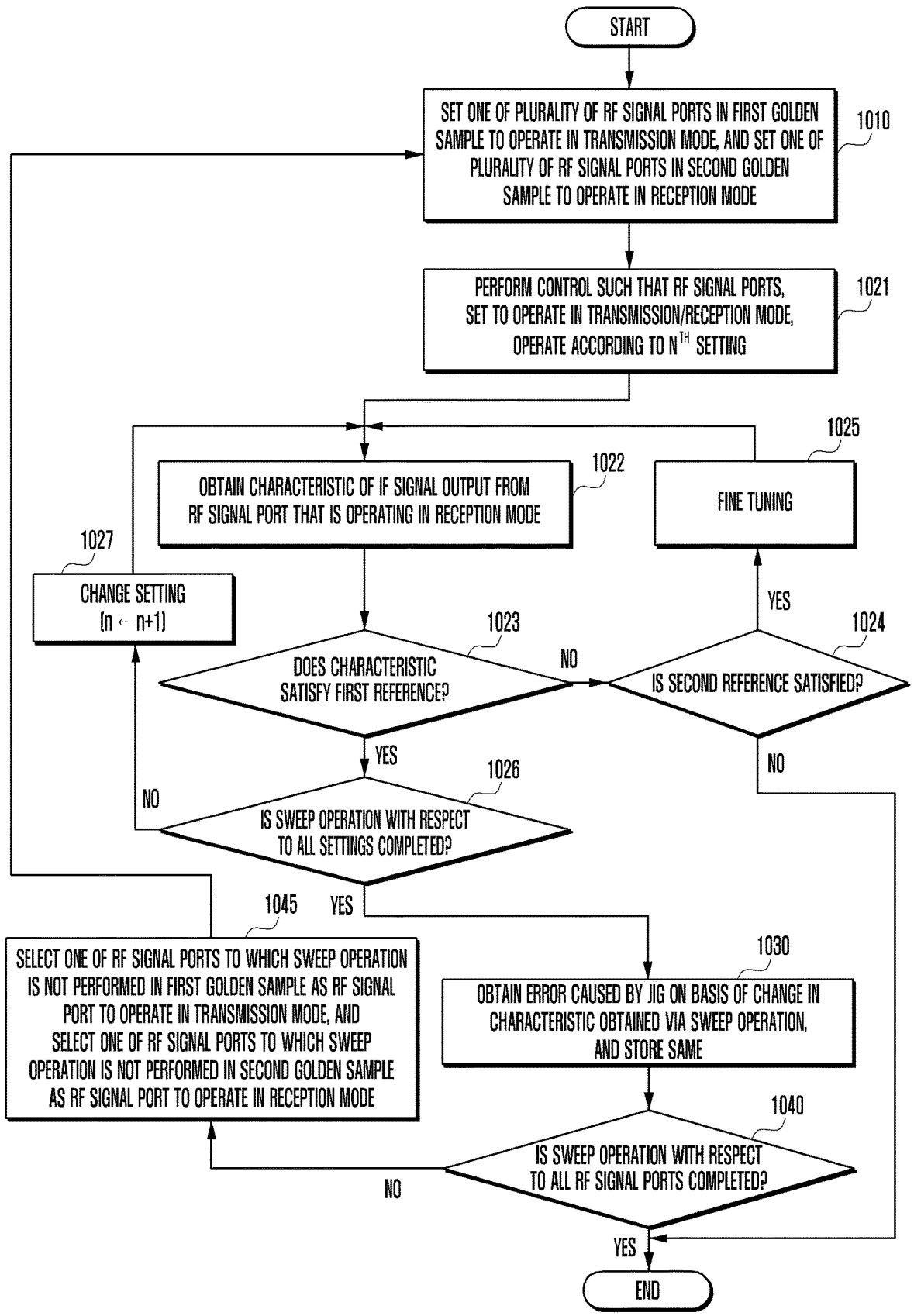
FIG. 10 is a flowchart illustrating a process for obtaining an error caused by an assist device and determining whether the assist device is defective when test and calibration is performed with respect to a chipset that supports wireless communication in an ultrahigh frequency band, according to certain embodiments.

FIG. 10 is a flowchart illustrating a process for obtaining an error caused by an assist device and determining whether the assist device is defective when test and calibration is performed with respect to a chipset that supports wireless communication in an ultrahigh frequency band, according to certain embodiments.

According to certain embodiments, the process of FIG. 10 may be executed by the calibration device 430 in the state in which both the first chipset 460 and the second chipset 470 are configured to be golden samples in the system of FIG. 4, or the processor of FIG. 10 may be executed by the calibration device 510 in the state in which the both the first chipset 540 and the second chipset 550 are configured to be golden samples in the system of FIG. 5.

According to certain embodiments, in operation 1010, the calibration device may set one of the first RF signal ports included in a first golden sample to operate in the transmission mode and may set one of the second RF signal ports included in a second golden sample to operate in the reception mode.

According to certain embodiments, when the characteristic of the IF signal obtained during a sweep operation does not satisfy a designated reference, the calibration device may perform fine tuning of settings (e.g., a gain and a phase) related to the operations of the first RF signal ports or the second RF signal ports that are operating in the transmission or reception mode. The calibration device may determine whether an assist device is defective on the basis of the characteristic of the IF signal obtained by tuning. For example, in operation 1021, the calibration device may perform control such that a first RF signal port or a second RF signal port, set to operate in the transmission or reception mode, operates according to an nth setting. In operation 1022, the calibration device may obtain, via a signal analysis device, the characteristic of an IF signal output from the first RF signal port or the second RF signal port that is operating in the reception mode. In operation 1023, the calibration device may determine whether the obtained characteristic satisfies a designated first reference. When the obtained characteristic does not satisfy the first reference, the calibration device may determine whether the obtained characteristic satisfies a second reference in operation 1024. When the obtained characteristic satisfies the second reference (e.g., when the obtained characteristic is within a scope of normality), the calibration device may perform fine tuning of the nth setting in operation 1025, and may perform operations 1022 and 1023 again. For example, the tuning may indicate tuning a gain within a range of 9.5 dB to 10.5 dB in the state in which the gain of an amplifier is set to 10 dB. When the obtained characteristic does not satisfy the second reference, the calibration device may determine that the assist device is defective, and may inform a user of the same via, for example, a display. When it is determined that the assist device is defective, the process of FIG. 10 may not be performed any longer and may be terminated. When the determination in operation 1023 shows that the obtained characteristic satisfies the first reference, the calibration device may determine whether the sweep operation with respect to all settings is completed in operation 1026. When the sweep operation is not completed, the calibration device may change the setting of the first RF signal port or the second RF signal port to an n+1th setting, which is a subsequent setting in operation 1027, and may perform operations 1022 and 1023 again. According to an embodiment, although the obtained characteristic satisfies the second reference, when a predetermined condition exists (e.g., when the number of times that tuning is performed for a corresponding setting exceeds a designated reference), it is determined that the assist device is defective.

According to certain embodiments, in operation 1030, the calibration device obtains "an error caused by a jig when a first golden sample is in the transmission mode" from the change in the characteristic obtained via the sweep operation, and stores the obtained error (e.g., in the memory of the calibration device).

According to certain embodiments, in operation 1040, the calibration device may determine whether the sweep operation with respect to the first RF signal ports or the second RF signal ports is completed. When a first RF signal port or a second RF signal port to which a sweep operation is not performed exists, the calibration device may select one of the first RF signal ports to which the sweep operation is not performed in the first golden sample as a first RF signal port to operate in the transmission mode, and may select one of the second RF signal ports to which the sweep operation is not performed in the second golden sample as a second RF signal port to operate in the reception mode in operation 1045, and may perform the above-described operations again.

When the sweep operation (e.g., a sweep operation on the basis that the first golden sample is in the transmission mode) is completed with respect to the first RF signal ports or the second RF signal ports, the process of FIG. 10 may be terminated. According to embodiments, alternatively or additionally, the second sweep operation on the basis that the first golden sample is in the reception mode may be performed. For example, only the transmission or reception mode is changed, and substantially the same operation as the above-described operations may be performed.

Figure 11:
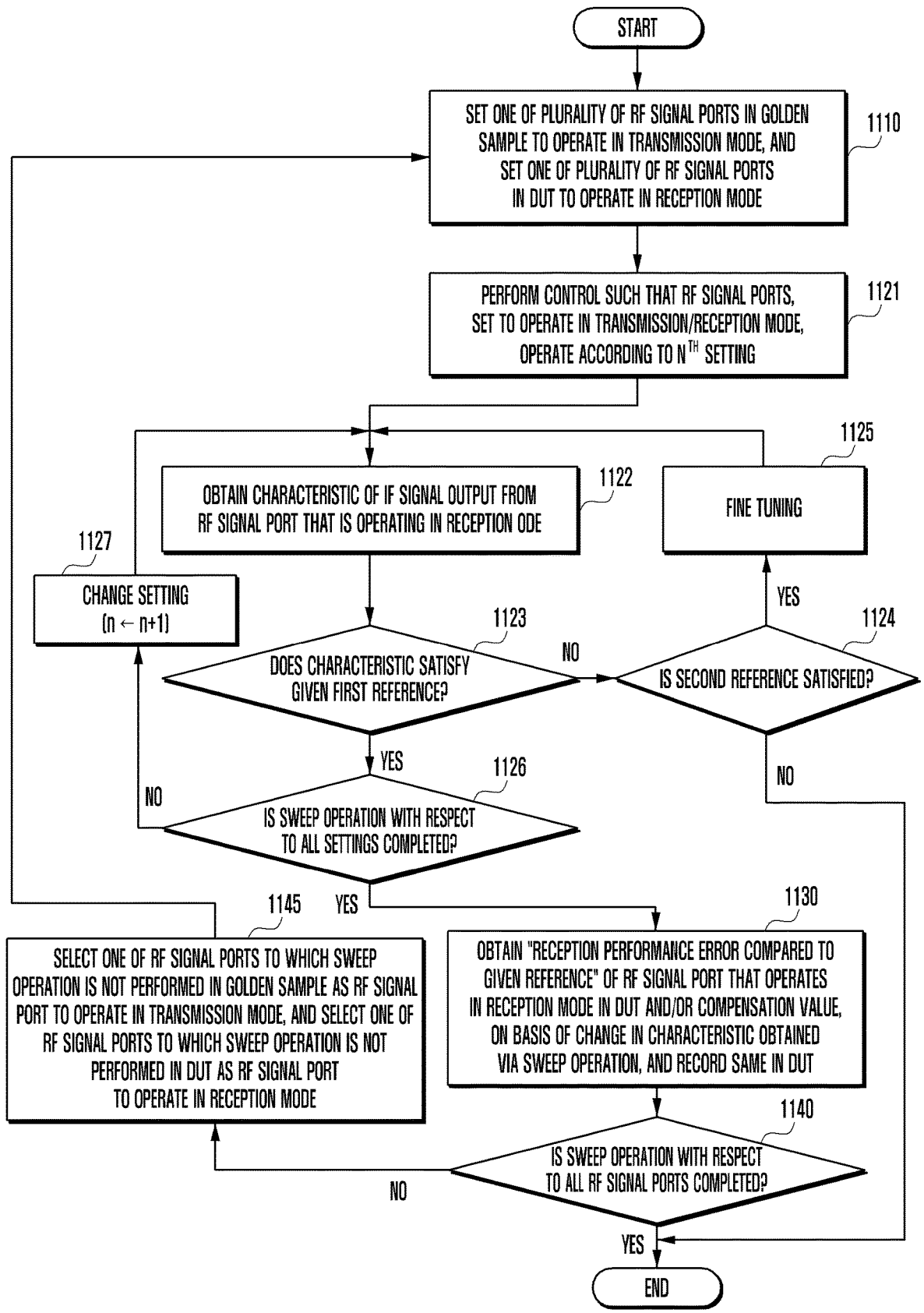
FIG. 11 is a flowchart illustrating a process of testing and calibrating a chipset that supports wireless communication of an ultrahigh frequency band, and determining whether the chipset is defective, according to certain embodiments.

FIG. 11 is a flowchart illustrating a process of testing and calibrating a chipset that supports wireless communication of an ultrahigh frequency band, and determining whether the chipset is defective, according to certain embodiments.

According to certain embodiments, the process of FIG. 11 may be executed by the calibration device 430 in the state in which one of the first chipset 460 and the second chipset 470 is configured to be a golden sample and the other one is configured to be a DUT in the system of FIG. 4, or the processor of FIG. 11 may be executed by the calibration device 510 in the state in which one of the first chipset 540 and the second chipset 550 is a golden sample and the other one is configured to be a DUT in the system of FIG. 5.

According to certain embodiments, in operation 1110, the calibration device may set one of the first RF signal ports included in the golden sample to operate in the transmission mode, and may set one of the second RF signal ports included in the DUT to operate in the reception mode.

According to certain embodiments, when the characteristic of an IF signal obtained during a first sweep operation does not satisfy a designated reference, the calibration device may perform fine tuning of settings (e.g., gain and phase) of the first RF signal port or the second RF signal ports that is operating in the transmission or reception mode. The calibration device may determine whether the DUT is defective on the basis of the characteristic of the IF signal obtained by tuning.

For example, in operation 1121, the calibration device may perform control such that the first RF signal port or the second RF signal port operates according to an nth setting.

In operation 1122, the calibration device may obtain, via a signal analysis device, the characteristic of an IF signal output from the first RF signal port or the second RF signal port that is operating in the reception mode in the DUT.

In operation 1123, the calibration device may determine whether the obtained characteristic satisfies a designated first reference. When the obtained characteristic does not satisfy the first reference, the calibration device may determine whether the obtained characteristic satisfies a designated second reference in operation 1124.

When the obtained characteristic satisfies the second reference, the calibration device may perform fine tuning of the nth setting in operation 1125, and may perform operations 1122 and 1123 again. When the obtained characteristic does not satisfy the second reference, the calibration device may determine that the DUT is defective, and may inform a user of the same via, for example, a display. When it is determined that the DUT is defective, the process of FIG. 11 may not be performed any longer and may be terminated.

When the determination in operation 1123 shows that the obtained characteristic satisfies the reference, the calibration device may determine whether the sweep operation with respect to all settings is completed in operation 1126.

When the sweep operation is not completed, the calibration device may change the setting of the first RF signal port or the second RF signal port to an n+1th setting, which is a subsequent setting, in operation 1127, and may perform operations 1122 and 1123 again. According to an embodiment, although the obtained characteristic satisfies the second reference, when a predetermined condition exists (e.g., when the number of times that tuning is performed for a corresponding setting exceeds a designated reference), it is determined that the DUT is defective.

According to certain embodiments, in operation 1130, from the change in the characteristic obtained via the first sweep operation, the calibration device may obtain "a reception performance error compared to a designated reference" of the second RF signal port that operates in the reception mode in the DUT and/or a compensation value, and may record the error and/or compensation value in the DUT via the assist device.

According to certain embodiments, in operation 1140, the calibration device may determine whether the first sweep operation with respect to all of the first RF signal ports or the second RF signal ports is completed. When a first RF signal port or a second RF signal port to which the first sweep operation is not performed exists, the calibration device may select one of the first RF signal ports to which the first sweep operation is not performed in the golden sample as a first RF signal port to operate in the transmission mode, and may select one of the second RF signal ports to which the first sweep operation is not performed in the DUT as a second RF signal port to operate in the reception mode in operation 1145, and may perform the above-described operations again.

After the first sweep operation is completed, the calibration device may perform a second sweep operation based on the case of golden sample_reception mode/DUT_transmission mode. For example, only the transmission or reception mode is changed, and substantially the same operation as the above-described operations of FIG. 11 may be performed.

According to certain embodiments, an electronic device (e.g., the electronic device 101 of FIG. 1) may include an interface (e.g., the interface 177 of FIG. 1) for connection to an external device, and a processor (e.g., the processor 120 of FIG. 1) electrically connected to the interface. The processor is configured to: select a first RF signal port of a first chipset (e.g., the first chipset 460 of FIG. 4 or the first chipset 540 of FIG. 5) and a second RF signal port of a second chipset (e.g., the second chipset 470 of FIG. 4 or the second chipset 550 of FIG. 5), which are electrically connected to the electronic device via the interface; set the first RF signal port to operate in RF signal transmission mode, and set the second RF signal port to operate in RF signal reception mode; obtain an error of transmission performance of the first RF signal port compared to a designated transmission reference, on the basis of a characteristic of a first intermediate frequency (IF) signal that is input to the first RF signal port and is output via the second RF signal port; obtain a first compensation value to enable the transmission performance of the first RF signal port to converge to the transmission reference, on the basis of the error of the transmission performance; store at least one of the error of the transmission performance and the first compensation value in the first chipset via the interface; set the first RF signal port to operate in the RF signal reception mode, and set the second RF signal port to operate in the RF signal transmission mode; obtain an error of reception performance of the first RF signal port compared to a designated reception reference, on the basis of a characteristic of a second IF signal which is input to the second RF signal port and is output via the first RF signal port; obtain a second compensation value to enable the reception performance of the first RF signal port to converge to the reception reference, on the basis of the error of the reception performance; and store at least one of the error of the reception performance and the second compensation value in the first chipset via the interface.

According to certain embodiments, while the first RF signal port is set to operate in the RF signal transmission mode and the second RF signal port is set to operate in the RF signal reception mode, the processor is configured to: change settings related to operations of the first RF signal port and the second RF signal port according to a designated order, so as to obtain a change in the characteristic of the first IF signal that is input to the first RF signal port and is output via the second RF signal port; and obtain the error of the transmission performance of the first RF signal port compared to the transmission reference, on the basis of the change in the characteristic of the first IF signal, and while the first RF signal port is set to operate in the RF signal reception mode and the second RF signal port is set to operate in the RF signal transmission mode, the processor is configured to: change settings related to operations of the first RF signal port and the second RF signal port according to a designated order, so as to obtain a change in the characteristic of the second IF signal that is input to the second RF signal port and is output via the first RF signal port; and obtain the error of the reception performance of the first RF signal port compared to the reception reference, on the basis of the change in the characteristic of the second IF signal.

According to certain embodiments, the settings related to the operations of the first RF signal port and the second RF signal port may include a gain of an amplification circuit and a phase shift value of an RF signal.

According to certain embodiments, when the characteristic of the first IF signal or the characteristic of the second IF signal does not satisfy a designated reference, the processor is configured to adjust a corresponding setting within a designated range.

According to certain embodiments, when the characteristic of the first IF signal or the characteristic of the second IF signal does not satisfy a second reference, the processor is configured to determine that the first RF signal port is defective.

According to certain embodiments, the first RF signal port (e.g., the first signal port 710 of FIG. 7) includes an RF transmission circuit (e.g., the first RF transmission circuit 711 of FIG. 7), an RF reception circuit (e.g., the first RF reception circuit 712 of FIG. 7), a phase shifter (e.g., the first phase shifter 714 of FIG. 7), and a switch (e.g., the first switch 713 of FIG. 7), the switch connects the phase shifter to one of the RF transmission circuit and the RF reception circuit, and the processor is configured to: set the first RF signal port to operate in the RF signal transmission mode by controlling the switch such that the phase shifter is connected to the RF transmission circuit and controlling a signal generation device (e.g., the signal generation device 410 of FIG. 4) electrically connected to the electronic device via the interface, so as to output an IF signal and a local oscillator (LO) signal to the RF transmission circuit. Also the processor is configured to set the first RF signal port to operate in the RF signal reception mode by controlling the switch such that the phase shifter is connected to the RF reception circuit and controlling the signal generation device via the interface so as to output an LO signal to the RF reception circuit.

According to certain embodiments, the processor is electrically connected, via the interface, to an assist device (e.g., the assist device 450 of FIG. 4 or the assist device 530 of FIG. 5) that enables transmission or reception of an RF signal to be performed between the first chipset and the second chipset, and by being electrically connected to the first chipset and the second chipset via the assist device, the processor controls operations of the first RF signal port and the second RF signal port.

According to certain embodiments, in the state in which a third chipset, instead of the first chipset, is connected to the assist device, the processor is configured to: obtain an error caused by the assist device, on the basis of a characteristic of an IF signal that is input to a third RF signal port of the third chipset and is output via the assist device and the second RF signal port and/or a characteristic of an IF signal that is input to the second RF signal port and is output via the assist device and the third RF signal port; and when obtaining the error of the transmission performance and the error of the reception performance, use the error caused by the assist device.

According to certain embodiments, a first connector (e.g., the first connector 220 of FIG. 2) and the first chipset electrically connected to the first connector are disposed in one side of a PCB (e.g., the PCB 210 of FIG. 2) which is a component of the assist device; a second connector (e.g., the second connector 230 of FIG. 2) and the second chipset electrically connected to the second connector are disposed in another side of the PCB; and the processor is configured to be electrically connected to the first chipset via the first connector, so as to control an operation of the first chipset; and is configured to be electrically connected to the second chipset via the second connector, so as to control an operation of the second chipset.

According to certain embodiments, the assist device may include a waveguide (e.g., the waveguide 365 of FIG. 3), a first switch (e.g., the first switch 363 of FIG. 3) that electrically connects an end of the waveguide to one of RF signal ports of the first chipset, and a second switch (e.g., the second switch 364 of FIG. 3) that electrically connects the other end of the waveguide to one of RF signal ports of the second chipset; and the processor is configured to control the first switch and the second switch so as to electrically connect the first RF signal port and the second RF signal port.

According to certain embodiments, the method of operating an electronic device (e.g., the electronic device 101 of FIG. 1) may include: selecting a first RF signal port and a second RF signal port respectively from a first chipset (e.g., the first chipset 460 of FIG. 4 or first chipset 540 of FIG. 5) and a second chipset (e.g., the second chipset 470 of FIG. 4 or the second chipset 550 of FIG. 5) which are electrically connected to the electronic device via an interface (e.g., the interface 177 of FIG. 1); setting the first RF signal port to operate in an RF signal transmission mode, and setting the second RF signal port to operate in an RF signal reception mode; obtaining an error of transmission performance of the first RF signal port compared to a designated transmission reference, on the basis of a characteristic of a first intermediate frequency (IF) signal that is input to the first RF signal port and is output via the second RF signal port; obtaining a first compensation value to enable the transmission performance of the first RF signal port to converge to the transmission reference on the basis of the error of the transmission performance; storing at least one of the error of the transmission performance and the first compensation value in the first chipset via the interface; setting the first RF signal port to operate in the RF signal reception mode, and setting the second RF signal port to operate in the RF signal transmission mode; obtaining an error of reception performance of the first RF signal port compared to a designated reception reference, on the basis of a characteristic of the second IF signal that is input to the second RF signal port and is output via the first RF signal port; obtaining a second compensation value to enable the reception performance of the first RF signal port to converge to the reception reference on the basis of the error of the reception performance; and storing at least one of the error of the reception performance and the second compensation value in the first chipset via the interface.

According to certain embodiments, the operation of obtaining the error of the transmission performance of the first RF signal port compared to the transmission reference may include: while the first RF signal port is set to operate in the RF signal transmission mode and the second RF signal port is set to operate in the RF signal reception mode, sequentially changing settings related to operations of the first RF signal port and the second RF signal port according to a designated order, so as to obtain a change in the characteristic of the first IF signal that is input to the first RF signal port and is output via the second RF signal port; and obtaining the error of the transmission performance of the first RF signal port compared to the transmission reference, on the basis of the change in the characteristic of the first IF signal. The operation of obtaining the error of the reception performance of the first RF signal port compared to the reception reference may include: while the first RF signal port is set to operate in the RF signal reception mode and the second RF signal port is set to operate in the RF signal transmission mode, sequentially changing settings related to operations of the first RF signal port and the second RF signal port according to a designated order, so as to obtain a change in the characteristic of the second IF signal that is input to the second RF signal port and is output via the first RF signal port; and obtaining the error of the reception performance of the first RF signal port compared to the reception reference, on the basis of the change in the characteristic of the second IF signal.

According to certain embodiments, the settings related to operations of the first RF signal port and the second RF signal port may include a gain of an amplification circuit and a phase shift value of an RF signal.

According to certain embodiments, when the characteristic of the first IF signal or the characteristic of the second IF signal does not satisfy a designated reference, the method may further include adjusting a corresponding setting within a designated range.

According to certain embodiments, when the characteristic of the first IF signal or the characteristic of the second IF signal does not satisfy a designated second reference, the method may further include determining that the first RF signal port is defective.

A system according to certain embodiments may include a signal generation device (e.g., the signal generation device 410 of FIG. 4), a signal analysis device (e.g., the signal analysis device 420 of FIG. 4), a power source device (e.g., the power source device 440 of FIG. 4, a calibration device (e.g., the calibration device 430 of FIG. 4), and an assist device configured to electrically connect a first chipset (e.g., the first chipset 460 of FIG. 4) and a second chipset (e.g., the second chipset 470 of FIG. 4) such that transmission or reception of an RF signal is performed between the first chipset and the second chipset, and configured to electrically connect the first chipset and the second chipset to the signal generation device, the signal analysis device, the power source device, and the calibration device. The calibration device is configured to: control the signal generation device to generate and transmit an LO signal to the first chipset and the second chipset; control the signal generation device to generate and transmit an IF signal to a chipset that operates in the RF signal transmission mode among the first chipset and the second chipset; control the first RF signal port of the first chipset to operate in an RF signal transmission mode, and control the second RF signal port of the second chipset to operate in an RF signal reception mode; receive, from the signal analysis device, characteristic information of a first IF signal that is input to the first RF signal port and is output via the second RF signal port; obtain an error of transmission performance of the first RF signal port compared to a designated transmission reference, on the basis of the characteristic information of the first IF signal; obtain a first compensation value to enable the transmission performance of the first RF signal port to converge to the transmission reference on the basis of the error of the transmission performance; store at least one of the error of the transmission performance and the first compensation value in the first chipset; control the first RF signal port to operate in the RF signal reception mode and control the second RF signal port to operate in the RF signal transmission mode; receive, from the signal analysis device, characteristic information of a second IF signal that is input to the second RF signal port and is output via the first RF signal port; obtain an error of reception performance of the first RF signal port compared to a designated reception reference, on the basis of the characteristic information of the second IF signal; obtain a second compensation value to enable the reception performance of the first RF signal port to converge to the reception reference on the basis of the error of the reception performance; and store at least one of the error of the reception performance and the second compensation value in the first chipset via the interface.

According to certain embodiments, while the first RF signal port is set to operate in the RF signal transmission mode and the second RF signal port is set to operate in the RF signal reception mode, the calibration device is configured to: change settings related to operations of the first RF signal port and the second RF signal port according to a designated order, so as to obtain a change in the characteristic of the first IF signal that is input to the first RF signal port and is output via the second RF signal port; and obtain the error of the transmission performance of the first RF signal port compared to the transmission reference, on the basis of the change in the characteristic of the first IF signal. While the first RF signal port is set to operate in the RF signal reception mode and the second RF signal port is set to operate in the RF signal transmission mode, the calibration device is configured to: change settings related to operations of the first RF signal port and the second RF signal port according to a designated order, so as to obtain a change in the characteristic of the second IF signal that is input to the second RF signal port and is output via the first RF signal port; and obtain the error of the reception performance of the first RF signal port compared to the reception reference, on the basis of the change in the characteristic of the second IF signal.

According to certain embodiments, the settings related to operations of the first RF signal port and the second RF signal port may include a gain of an amplification circuit and a phase shift value of an RF signal.

According to certain embodiments, when the characteristic of the first IF signal or the characteristic of the second IF signal does not satisfy a designated reference, the calibration device is configured to adjust a corresponding setting within a designated range.

According to certain embodiments, when the characteristic of the first IF signal or the characteristic of the second IF signal does not satisfy a designated second reference, the calibration device is configured to determine that the first RF signal port is defective.

The embodiments of the disclosure disclosed in the specification and the drawings are only particular examples proposed in order to easily describe the technical matters of the disclosure and help with comprehension of the disclosure, and do not limit the scope of the disclosure. Therefore, in addition to the embodiments disclosed herein, the scope of the certain embodiments of the disclosure should be construed to include all modifications or modified forms drawn based on the technical idea of the certain embodiments of the disclosure.

What is claimed is:

1. An electronic device, comprising:
an interface for connection to an external device; and
a processor electrically connected to the interface,
wherein the processor is configured to:
set a first radio frequency (RF) signal port of a first chipset to operate in RF signal transmission mode, and set a second RF signal port of a second chipset to operate in RF signal reception mode, wherein the first RF signal port in the RF signal transmission mode receives an intermediate frequency (IF) signal, converts the received IF signal to a converted RF signal and outputs the converted RF signal, and the second RF signal port in the RF signal reception mode receives an RF signal, converts the received RF signal into a converted IF signal and outputs the converted IF signal;
obtain an error of transmission performance compared to a designated transmission reference, based on a characteristic of a first IF signal, wherein the first IF signal is input to the first RF signal port in the RF signal transmission mode and then output via the second RF signal port in the RF signal reception mode;
obtain a first compensation value to enable the transmission performance of the first RF signal port to converge to the transmission reference, on the basis of the error of the transmission performance; and
store at least one of the error of the transmission performance and the first compensation value in the first chipset via the interface.

2. The electronic device of claim 1, wherein the processor is further configured to:
set the first RF signal port to operate in the RF signal reception mode, and set the second RF signal port to operate in the RF signal transmission mode, wherein the first RF signal port in the RF signal reception mode receives the RF signal, converts the received RF signal into the converted IF signal and outputs the converted IF signal, and the second RF signal port in the RF signal transmission mode receives the IF signal, converts the received IF signal to the converted RF signal and outputs the converted RF signal;
obtain an error of reception performance compared to a designated reception reference, based on a characteristic of a second IF signal, wherein the second IF signal is input to the second RF signal port and then output via the first RF signal port;
obtain a second compensation value to enable the reception performance of the first RF signal port to converge to the reception reference, on the basis of the error of the reception performance; and
store at least one of the error of the reception performance and the second compensation value in the first chipset via the interface.

3. The electronic device of claim 2, wherein, while the first RF signal port is set to operate in the RF signal transmission mode and the second RF signal port is set to operate in the RF signal reception mode, and the processor is configured to:
change settings related to operations of the first RF signal port and the second RF signal port according to a designated order, so as to obtain a change in the characteristic of the first IF signal that is input to the first RF signal port and is output via the second RF signal port; and
obtain the error of the transmission performance of the first RF signal port compared to the transmission reference, on the basis of the change in the characteristic of the first IF signal, and
while the first RF signal port is set to operate in the RF signal reception mode and the second RF signal port is set to operate in the RF signal transmission mode, the processor is configured to:
change settings related to operations of the first RF signal port and the second RF signal port according to another designated order, so as to obtain a change in the characteristic of the second IF signal that is input to the second RF signal port and is output via the first RF signal port; and
obtain the error of the reception performance of the first RF signal port compared to the reception reference, on the basis of the change in the characteristic of the second IF signal.

4. The electronic device of claim 3, wherein the settings related to the operations of the first RF signal port and the second RF signal port include a gain of an amplification circuit and a phase shift value of the RF signal.

5. The electronic device of claim 3, wherein, when the characteristic of the first IF signal or the characteristic of the second IF signal does not satisfy a designated reference, the processor is configured to adjust a corresponding setting within a designated range.

6. The electronic device of claim 5, wherein, when the characteristic of the first IF signal or the characteristic of the second IF signal does not satisfy a designated second reference, the processor is configured to determine that the first RF signal port is defective.

7. The electronic device of claim 2, wherein the first RF signal port includes an RF transmission circuit, an RF reception circuit, a phase shifter, and a switch, the switch connects the phase shifter to one of the RF transmission circuit and the RF reception circuit, and the processor is configured to:
set the first RF signal port to operate in the RF signal transmission mode by controlling the switch such that the phase shifter is connected to the RF transmission circuit and controlling a signal generation device electrically connected to the electronic device via the interface, so as to output the IF signal and a local oscillator (LO) signal to the RF transmission circuit; and
set the first RF signal port to operate in the RF signal reception mode by controlling the switch such that the phase shifter is connected to the RF reception circuit and controlling the signal generation device via the interface so as to output an LO signal to the RF reception circuit.

8. The electronic device of claim 2, wherein the processor is electrically connected, via the interface, to an assist device that enables transmission or reception of the RF signal to be performed between the first chipset and the second chipset, and
by being electrically connected to the first chipset and the second chipset via the assist device, the processor controls operations of the first RF signal port and the second RF signal port.

9. The electronic device of claim 8, wherein, in a state in which a third chipset, instead of the first chipset, is connected to the assist device, and the processor is configured to:
obtain an error caused by the assist device, on the basis of a characteristic of an IF signal that is input to a third RF signal port of the third chipset and is output via the assist device and the second RF signal port or a characteristic of an IF signal that is input to the second RF signal port and is output via the assist device and the third RF signal port; and when obtaining the error of the transmission performance and the error of the reception performance, use the error caused by the assist device.

10. The electronic device of claim 8, wherein a first connector and the first chipset electrically connected to the first connector are disposed in one side of a PCB which is a component of the assist device;

a second connector and the second chipset electrically connected to the second connector are disposed in another side of the PCB; and the processor is configured to be electrically connected to the first chipset via the first connector, so as to control an operation of the first chipset; and is configured to be electrically connected to the second chipset via the second connector, so as to control an operation of the second chipset.

11. The electronic device of claim 8, wherein the assist device comprises a waveguide, a first switch that electrically connects an end of the waveguide to one of RF signal ports of the first chipset, and a second switch that electrically connects the other end of the waveguide to one of RF signal ports of the second chipset; and the processor is configured to control the first switch and the second switch so as to electrically connect the first RF signal port and the second RF signal port.

12. A method of operating an electronic device, the method comprising:

selecting a first radio frequency (RF) signal port from a first chipset and a second RF signal port from a second chipset, wherein the first chipset and the second chipset are electrically connected to the electronic device via an interface;

setting the first RF signal port to operate in an RF signal transmission mode, and setting the second RF signal port to operate in an RF signal reception mode, wherein the first RF signal port in the RF signal transmission mode receives an intermediate frequency (IF) signal, converts the received IF signal to a converted RF signal and outputs the converted RF signal, and the second RF signal port in the RF signal reception mode receives an RF signal, converts the received RF signal into a converted IF signal and outputs the converted IF signal;

obtaining an error of transmission performance compared to a designated transmission reference, based on a characteristic of a first IF signal, wherein the first IF signal is input to the first RF signal port in the RF signal transmission mode and then output via the second RF signal port in the RF signal reception mode;

obtaining a first compensation value to enable the transmission performance of the first RF signal port to converge to the transmission reference on the basis of the error of the transmission performance; and storing at least one of the error of the transmission performance and the first compensation value in the first chipset via the interface.

13. The method of claim 12, further comprising:

setting the first RF signal port to operate in the RF signal reception mode, and setting the second RF signal port to operate in the RF signal transmission mode, wherein the first RF signal port in the RF signal reception mode receives the RF signal, converts the received RF signal into the converted IF signal and outputs the converted IF signal, and the second RF signal port in the RF signal transmission mode receives the IF signal, converts the received IF signal to the converted RF signal and outputs the converted RF signal;

obtaining an error of reception performance compared to a designated reception reference, based on a characteristic of a second IF signal, wherein the second IF signal is input to the second RF signal port and then output via the first RF signal port;

obtaining a second compensation value to enable the reception performance of the first RF signal port to converge to the reception reference on the basis of the error of the reception performance; and storing at least one of the error of the reception performance and the second compensation value in the first chipset via the interface.

14. The method of claim 13, wherein the obtaining of the error of the transmission performance of the first RF signal port compared to the transmission reference comprises:

while the first RF signal port is set to operate in the RF signal transmission mode and the second RF signal port is set to operate in the RF signal reception mode, sequentially changing settings related to operations of the first RF signal port and the second RF signal port according to a designated order, so as to obtain a change in the characteristic of the first IF signal that is input to the first RF signal port and is output via the second RF signal port; and obtaining the error of the transmission performance of the first RF signal port compared to the transmission reference, on the basis of the change in the characteristic of the first IF signal, and the obtaining of the error of the reception performance of the first RF signal port compared to the reception reference comprising:

while the first RF signal port is set to operate in the RF signal reception mode and the second RF signal port is set to operate in the RF signal transmission mode, sequentially changing settings related to operations of the first RF signal port and the second RF signal port according to another designated order, so as to obtain a change in the characteristic of the second IF signal that is input to the second RF signal port and is output via the first RF signal port; and obtaining the error of the reception performance of the first RF signal port compared to the reception reference, on the basis of the change in the characteristic of the second IF signal.

15. The method of claim 14, wherein the settings related to operations of the first RF signal port and the second RF signal port include a gain of an amplification circuit and a phase shift value of the RF signal.

16. The method of claim 14, wherein, when the characteristic of the first IF signal or the characteristic of the second IF signal does not satisfy a designated reference, the method further comprises adjusting a corresponding setting within a designated range.

17. The method of claim 15, wherein, when the characteristic of the first IF signal or the characteristic of the second IF signal does not satisfy a designated second reference, the method further comprises determining that the first RF signal port is defective.

18. A system for testing a wireless communication circuit, the system comprising:

a signal generation device;
a signal analysis device;
a power source device;
a calibration device; and an assist device configured to electrically connect a first chipset and a second chipset such that transmission or reception of a radio frequency (RF) signal is performed between the first chipset and the second chipset, and configured to electrically connect the first chipset and the second chipset to the signal generation device, the signal analysis device, the power source device, and the calibration device, wherein the calibration device is configured to:

control the signal generation device to generate and transmit an LO signal to the first chipset and the second chipset;

control the signal generation device to generate and transmit an IF signal to a chipset that operates in an RF signal transmission mode among the first chipset and the second chipset;

control a first RF signal port of the first chipset to operate in the RF signal transmission mode, and control a second RF signal port of the second chipset to operate in an RF signal reception mode, wherein the first RF signal port in the RF signal transmission mode receives an intermediate frequency (IF) signal, converts the received IF signal to a converted RF signal and outputs the converted RF signal, and the second RF signal port in the RF signal reception mode receives an RF signal, converts the received RF signal into a converted IF signal and outputs the converted IF signal;

receive, from the signal analysis device, characteristic information of a first IF signal that is input to the first RF signal port and then output via the second RF signal port;

obtain an error of transmission performance of the first RF signal port compared to a designated transmission reference, on the basis of the characteristic information of the first IF signal;

obtain a first compensation value to enable the transmission performance of the first RF signal port to converge to the transmission reference on the basis of the error of the transmission performance; and store at least one of the error of the transmission performance and the first compensation value in the first chipset.

19. The system of claim 18, wherein the calibration device is further configured to:

control the first RF signal port to operate in the RF signal reception mode and control the second RF signal port to operate in the RF signal transmission mode, wherein the first RF signal port in the RF signal reception mode receives the RF signal, converts the received RF signal into the converted IF signal and outputs the converted IF signal, and the second RF signal port in the RF signal transmission mode receives the IF signal, converts the received IF signal to the converted RF signal and outputs the converted RF signal;

receive, from the signal analysis device, characteristic information of a second IF signal that is input to the second RF signal port and then output via the first RF signal port;

obtain an error of reception performance of the first RF signal port compared to a designated reception reference, on the basis of the characteristic information of the second IF signal;

obtain a second compensation value to enable the reception performance of the first RF signal port to converge to the reception reference, on the basis of the error of the reception performance; and store at least one of the error of the reception performance and the second compensation value in the first chipset via an interface.

20. The system of claim 19, wherein, while the first RF signal port is set to operate in the RF signal transmission mode and the second RF signal port is set to operate in the RF signal reception mode, the calibration device is configured to: change settings related to operations of the first RF signal port and the second RF signal port according to a designated order, so as to obtain a change in the characteristic of the first IF signal that is input to the first RF signal port and is output via the second RF signal port; and obtain the error of the transmission performance of the first RF signal port compared to the transmission reference, on the basis of the change in the characteristic of the first IF signal, and while the first RF signal port is set to operate in the RF signal reception mode and the second RF signal port is set to operate in the RF signal transmission mode, the calibration device is configured to: change settings related to operations of the first RF signal port and the second RF signal port according to the designated order, so as to obtain a change in the characteristic of the second IF signal that is input to the second RF signal port and is output via the first RF signal port; and obtain the error of the reception performance of the first RF signal port compared to the reception reference, on the basis of the change in the characteristic of the second IF signal.

* * * * *